(12) United States Patent
lim

(10) Patent No.: US 12,730,536 B2
(45) Date of Patent: Sep. 8, 2026

(54) DISPLAY DEVICE

(71) Applicant: SAMSUNG DISPLAY CO., LTD., Yongin-si (KR)

(72) Inventor: Sanghyun lim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 56 days.

(21) Appl. No.: 18/817,842

(22) Filed: Aug. 28, 2024

(65) Prior Publication Data

US 2025/0085809 A1 Mar. 13, 2025

(30) Foreign Application Priority Data

Sep. 11, 2023 (KR) ........................ 10-2023-0120211

(51) Int. Cl.

| | |
|---|---|
| ***G06F 3/041*** | (2006.01) |
| ***G06F 3/044*** | (2006.01) |
| ***H10K 59/40*** | (2023.01) |

(52) U.S. Cl.

CPC .......... *G06F 3/0418* (2013.01); *G06F 3/0412* (2013.01); *G06F 3/0446* (2019.05); *G06F 2203/04107* (2013.01); *G06F 2203/04111* (2013.01); *H10K 59/40* (2023.02)

(58) Field of Classification Search

CPC . G06F 2203/04107; G06F 2203/04111; G06F 3/0412; G06F 3/04164; G06F 3/0418; G06F 3/0443; G06F 3/0446

See application file for complete search history.

(56) References Cited

U.S. PATENT DOCUMENTS

| | | | | |
|---|---|---|---|---|
| 10,770,518 B2 | 9/2020 | Choi et al. | |
| 11,803,264 B2 | 10/2023 | Cho et al. | |
| 2020/0110499 A1* | 4/2020 | Lee | G06F 3/0412 |
| 2020/0310575 A1* | 10/2020 | He | G06F 3/0412 |
| 2021/0141477 A1* | 5/2021 | Yang | G06F 3/0412 |
| 2022/0147193 A1 | 5/2022 | Kim et al. | |
| 2023/0217778 A1* | 7/2023 | Han | G06F 3/0443 345/173 |
| 2024/0196673 A1* | 6/2024 | Wu | H10K 59/131 |

FOREIGN PATENT DOCUMENTS

| | | |
|---|---|---|
| KR | 10-2021-0011781 A | 2/2021 |
| KR | 10-2021-0085571 A | 7/2021 |
| KR | 10-2361262 B1 | 2/2022 |
| KR | 10-2022-0023895 A | 3/2022 |

* cited by examiner

*Primary Examiner* — Robin J Mishler
(74) *Attorney, Agent, or Firm* — F. CHAU & ASSOCIATES, LLC

(57) ABSTRACT

A display device includes a display panel including an active area, and a peripheral area adjacent to the active area. An input sensor is on the display panel. The input sensor includes a sensing area corresponding to the active area, and a non-sensing area corresponding to the peripheral area. The input sensor includes a plurality of sensing patterns disposed in the sensing area. A plurality of signal lines are connected to the plurality of sensing patterns, respectively. The plurality of signal lines is in the non-sensing area. A ground line is disposed in the non-sensing area. The ground line receives a ground voltage. An additional electrode is in the non-sensing area. The additional electrode is electrically connected to the ground line. The display panel includes a sealing member disposed in the peripheral area. The additional electrode overlaps at least a portion of the sealing member on a plane.

20 Claims, 18 Drawing Sheets

EA-1
100
200
BZA
NAA
SLA
SGA
TA
AA
BZP CDP INK
AP
GND
SM
SL
GP
IV'
IV
WIN
ADL
POL
222
SP
221
210-U
210-OLED
210-CL
210-G

DISPLAY DEVICE

CROSS-REFERENCE TO RELATED APPLICATIONS

This application claims priority under 35 U.S.C. § 119 to Korean Patent Application No. 10-2023-0120211, filed on Sep. 11, 2023 in the Korean Intellectual Property Office, the disclosure of which is incorporated by reference in its entirety herein.

1. Technical Field

Embodiments of the present disclosure described herein relate to a display device, and more particularly, relate to a display device including an input sensor.

2. Discussion of Related Art

Multimedia devices, such as televisions, mobile phones, tablets, navigation systems and gaming devices include a display device that displays an image to a user through a display screen. The display device may include a display panel that generates an image and an input sensor that detects a user input, such as a touch of a user.

The input sensor may include a conductor that detects an external input. For example, the input sensor disposed on the display panel may detect an input of the user in a capacitive scheme. In the capacitive scheme, a driving signal is applied to sensing electrodes included in the input sensor, and a change in the capacitance of the sensing electrodes is output as a sensing signal. The driving signal is applied to the sensing electrodes through sensing wiring lines. When the driving signal having a specific frequency is applied to the sensing electrodes, electromagnetic waves according to the driving signal may be radiated as an unnecessary electromagnetic signal.

The electromagnetic signal may act as noise on another device, and may hinder an operation of such device. The phenomenon may be defined as an electromagnetic interference (EMI). Therefore, research is being conducted concerning technologies for reducing EMI.

SUMMARY

Embodiments of the present disclosure provide an input sensor, and a display device including the same.

According to an embodiment of the present disclosure, a display device includes a display panel including an active area, and a peripheral area adjacent to the active area. An input sensor is on the display panel. The input sensor includes a sensing area corresponding to the active area, and a non-sensing area corresponding to the peripheral area. The input sensor includes a plurality of sensing patterns disposed in the sensing area. A plurality of signal lines are connected to the plurality of sensing patterns, respectively. The plurality of signal lines is in the non-sensing area. A ground line is disposed in the non-sensing area. The ground line receives a ground voltage. An additional electrode is in the non-sensing area. The additional electrode is electrically connected to the ground line. The display panel includes a sealing member disposed in the peripheral area. The additional electrode overlaps at least a portion of the sealing member on a plane.

In an embodiment, the ground line may be spaced apart from the sensing area with the plurality of signal lines interposed therebetween.

In an embodiment, the display panel may include a display substrate including a light emitting element. An encapsulation substrate is disposed on the display substrate. The sealing member bonds the display substrate to the encapsulation substrate.

In an embodiment, one end of the sealing member may be aligned with one end of the encapsulation substrate.

In an embodiment, the encapsulation substrate may include an extension part extending from one end of the sealing member. The input sensor may further include a low-resistance pattern disposed directly on the extension part.

In an embodiment, the additional electrode may include a same material as the plurality of sensing patterns.

In an embodiment, each of the additional electrode and the plurality of sensing patterns may include a transparent conductive oxide.

In an embodiment, the ground line may include a same material as the plurality of signal lines.

In an embodiment, the plurality of signal lines may include outer signal lines that are spaced apart from the sensing area with the ground line interposed therebetween. The input sensor may further include an insulating pattern covering an upper portion of the outer signal line.

In an embodiment, the input sensor may include a first insulating layer disposed on the display panel, and a second insulating layer disposed on the first insulating layer.

In an embodiment, the plurality of signal lines and the ground line may be disposed under the first insulating layer. The plurality of sensing patterns and the additional electrode may be disposed above the first insulating layer.

The plurality of sensing patterns and the additional electrode may be disposed under the first insulating layer, and the plurality of signal lines and the ground line may be disposed on the first insulating layer.

In an embodiment, the display device may further include a window disposed on the input sensor. The window includes a base substrate including a transmissive area that is optically transparent, and a bezel area adjacent to the transmissive area. A conductive electrode overlaps the bezel area. The conductive electrode is disposed under the base substrate.

In an embodiment, the input sensor may further include a dummy pattern disposed in the non-sensing area. The dummy pattern is disposed on a same layer as the plurality of signal lines. The dummy pattern is spaced apart from the signal lines on a plane.

In an embodiment, the additional electrode may be electrically connected to at least a portion of the dummy pattern.

In an embodiment, at least a portion of the ground lines may have a greater width than a width of each of the plurality of signal lines.

In an embodiment, the input sensor may include two short sides extending along a first direction and spaced apart from each other along a second direction crossing the first direction, and two long sides extending along the second direction and spaced apart from each other along the first direction. The additional electrode may be disposed on at least one side of the two short sides and the two long sides.

In an embodiment, each of the ground line and the plurality of signal lines may not overlap the sealing member on a plane.

According to an embodiment of the present disclosure, a display device includes a display panel including an active area, and a peripheral area adjacent to the active area. An input sensor is disposed on the display panel. The input sensor includes a sensing area corresponding to the active area, and a non-sensing area corresponding to the peripheral area. The input sensor includes a plurality of signal lines disposed in the non-sensing area, a ground line disposed in the non-sensing area, and an additional electrode disposed in the non-sensing area. The additional electrode is electrically connected to the ground line. The display panel includes a sealing member disposed in the peripheral area. The additional electrode overlaps the sealing member on a plane. The plurality of signal lines and the ground line do not overlap with the sealing member on a plane.

According to an embodiment of the present disclosure, a display device includes a display panel including an active area, and a peripheral area adjacent to the active area. An input sensor is disposed on the display panel. The input sensor includes a sensing area corresponding to the active area, and a non-sensing area corresponding to the peripheral area. The input sensor includes a plurality of sensing patterns disposed in the sensing area. The plurality of sensing patterns includes a transparent conductive oxide. A plurality of signal lines is connected to the plurality of sensing patterns, respectively. The plurality of signal lines is disposed in the non-sensing area, and includes a low-resistance metal. A ground line is disposed in the non-sensing area. The ground line includes a low-resistance metal. An additional electrode is disposed in the non-sensing area. The additional electrode is electrically connected to the ground line. The additional electrode includes a transparent conductive oxide. The additional electrode is electrically insulated from the plurality of signal lines.

BRIEF DESCRIPTION OF THE DRAWING

The above and other objects and features of the present disclosure will become apparent by describing in detail non-limiting embodiments thereof with reference to the accompanying drawings.

FIGS. 7 to 9 are cross-sectional views of a display module according to embodiments of the present disclosure.

FIG. 10 is a cross-sectional view of a display device according to an embodiment of the present disclosure.

DETAILED DESCRIPTION OF EMBODIMENTS

Figure 1A:
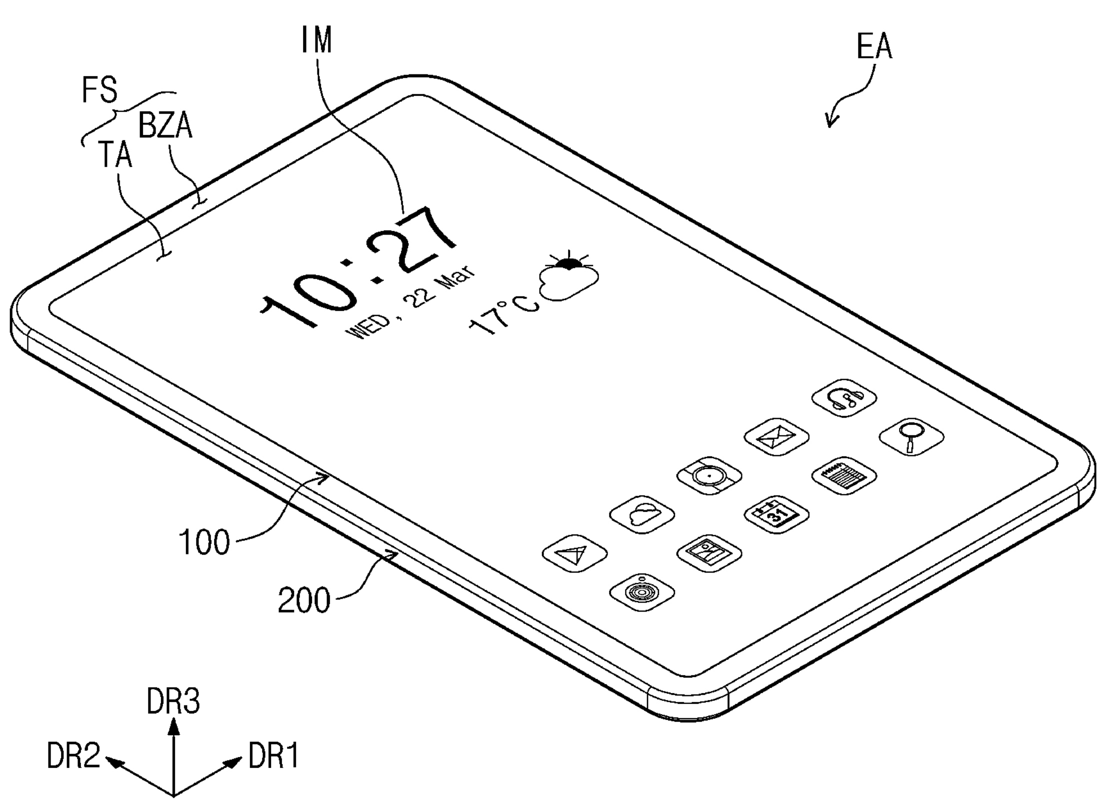
FIG. 1A is a perspective view of a display device according to an embodiment of the present disclosure.

In the present specification, the expression that a first component (or area, layer, part, portion, etc.) is "on", "connected with", or "coupled to" a second component means that the first component is directly on, connected with, or coupled to the second component or means that a third component is interposed therebetween.

The expression of "directly disposed" may mean that none of a layer, a film, an area, a plate or another intervening element is added between a part, such as the layer, the film, the area, and the plate, and another part. For example, the expression of "directly disposed" may mean that the two layers or two members are disposed while an additional member (e.g., intervening element), such as an adhesive member, is not used therebetween.

The same reference numerals denote the same components. Furthermore, in the drawings, thicknesses, ratios, dimensions of the components may be exaggerated for an effective description of the technical contents. The term "and/or" includes one or more combinations that may be defined by the associated components.

Furthermore, in describing the various components, the terms, such as first and second may be used, but the present disclosure is not limited by the terms. The terms are simply for distinguishing the components. For example, a first component may be named a second component, and similarly the second component also may be named the first component while not departing from the scope of the present disclosure. A singular expression includes a plural expression unless an exemption is explicitly described in the context.

Furthermore, the terms, such as "under", "below", "on", and "above", are used to describe an associative relationship between the components illustrated in the drawings. The terms are relative concepts, and are described with respect to directions indicated in the drawings.

When the terms, such as "comprise" and/or "comprising", is used in the specification, it should be understood that they specify presence of the above-mentioned features, numbers, steps, operations, components, parts, and/or combinations thereof, and do not exclude the presence or addition of one or more other features, numbers, steps, operations, components, parts, and/or combinations thereof.

Unless otherwise defined, all terms, including technical and scientific terms, used herein have the same meaning as commonly understood by those skilled in the art to which the present disclosure pertains. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

Hereinafter, embodiments of the present disclosure will be described with reference to the drawings.

Figure 1B:
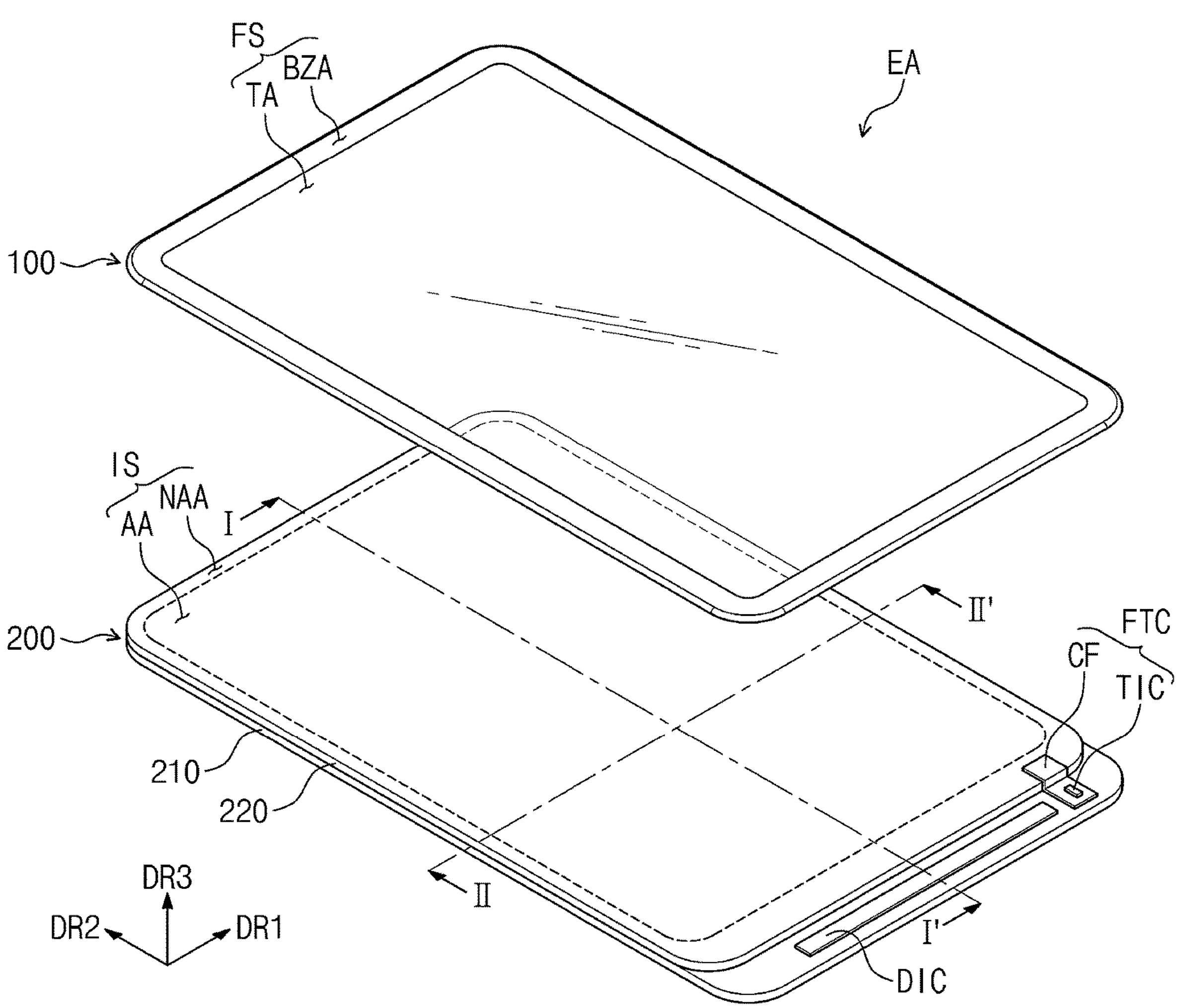
FIG. 1B is an exploded perspective view of a display device according to an embodiment of the present disclosure.
Figure 1C:
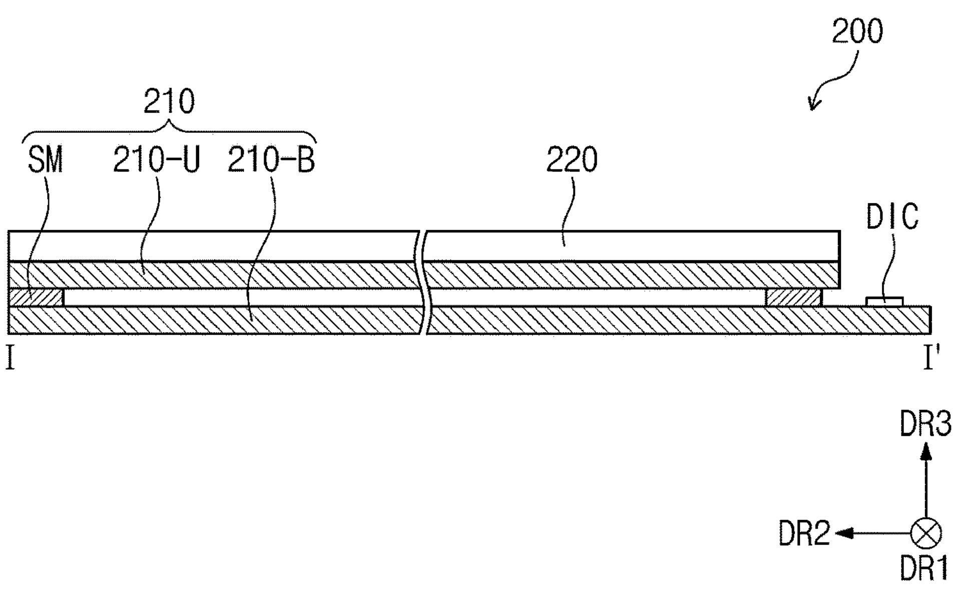
FIG. 1C is a cross-sectional view of a display device taken along line I-I' of FIG. 1B according to an embodiment of the present disclosure.
Figure 1D:
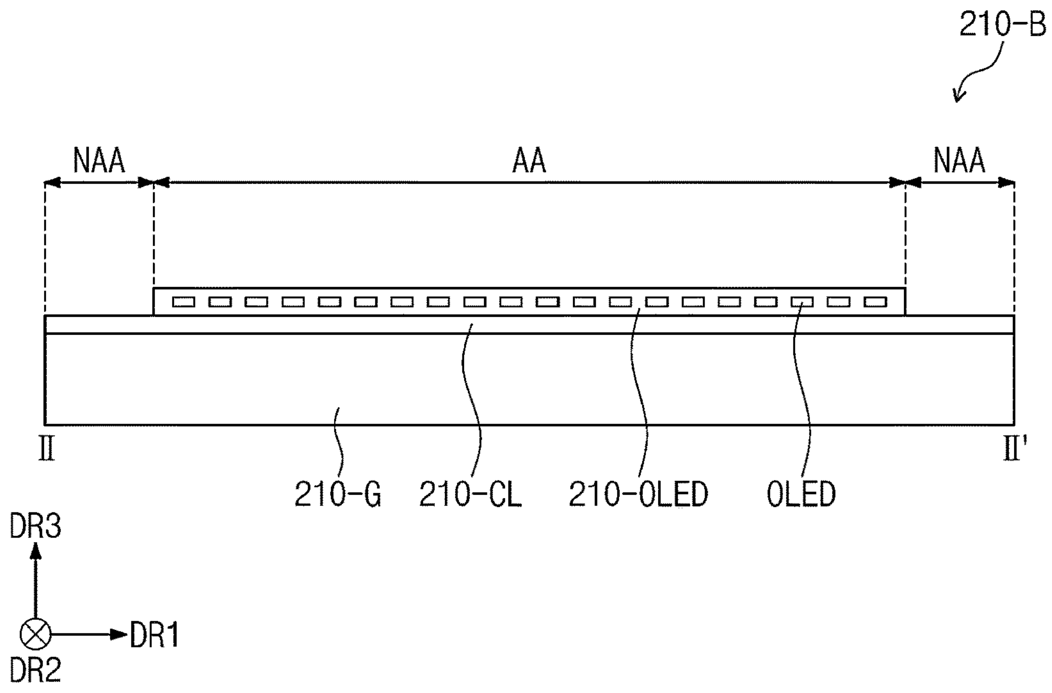
FIG. 1D is a cross-sectional view of a display substrate taken along line II-II' of FIG. 1B according to an embodiment of the present disclosure.

FIG. 1A is a perspective view of a display device EA according to an embodiment of the present disclosure. FIG. 1B is an exploded perspective view of the display device EA according to an embodiment of the present disclosure. FIG. 1C is a cross-sectional view of the display device EA according to an embodiment of the present disclosure. FIG. 1D is a cross-sectional view of a display substrate 210-B according to an embodiment of the present disclosure. FIG. 1C illustrates a cross-section corresponding to line I-I' of FIG. 1B. FIG. 1D illustrates a cross-section corresponding to line II-II' of FIG. 1B. Hereinafter, the display device EA according to embodiments of the present embodiment, and the display substrate 210-B included therein will be described with reference to FIGS. 1A to 1D.

Referring to FIG. 1A, the display device EA may be a device that is activated according to an electric signal. The display device EA may include various embodiments. For example, the display device EA may include a tablet, a notebook, a computer, a smart television, and a display for a vehicle. In an embodiment shown in FIG. 1A, the display device EA is illustrated as a tablet. However, embodiments of the present disclosure are not necessarily limited thereto.

The display device EA may display an image IM through a display surface FS. In an embodiment, the display surface FS extends in a plane that is defined by a first direction DR1 and a second direction DR2. A normal direction of the display surface FS, such as a thickness direction of the display device EA is indicated by a third direction DR3. Front surfaces (e.g., upper surfaces) and rear surfaces (e.g., lower surfaces) of members or units that will be described below are spaced apart from each other in the third direction DR3. Hereinafter, the first to third directions DR1, DR2, and DR3 are defined as directions indicated by first to third directional axes, and the same reference numerals are referenced. While an embodiment shown in FIG. 1A shows the first to third directions DR1 to DR3 as being perpendicular to each other, embodiments of the present disclosure are not necessarily limited thereto and the first to third directions DR1 to DR3 may cross each other at various different angles.

In an embodiment, the display surface FS, on which the image IM is displayed, may correspond to a front surface of the display device EA, and may correspond to a front surface FS of a window 100, which will be described below with reference to FIG. 1B. Hereinafter, the display surface and the front surface of the display device EA, and the front surface of the window 100 are denoted by the same reference numerals. FIG. 1A illustrates software application icons, a clock, temperature and calendar window as an example of the image IM. However embodiments of the present inventive concepts are not necessarily limited thereto and the image IM may be various different subject matter.

Referring to FIG. 1B, the display device EA includes the window 100 and a display module 200. In an embodiment, the display device EA may further include an optical member POL (see FIG. 10) and an adhesive layer ADL (see FIG. 10) that are disposed between the window 100 and the display module 200 (e.g., in the third direction DR3). In an embodiment, the optical member may include a polarizer. Alternatively, the optical member may include a color filter member that lowers an external light reflectance.

The window 100 includes a base substrate. For example, in an embodiment, the base substrate may include glass or plastic, or a combination thereof. The front surface FS of the window 100 includes a transmissive area TA and a bezel area BZA. The transmissive area TA may be an optically transparent area. For example, in an embodiment, the transmissive area TA may be an area having a visual ray transmittance greater than or equal to about 90%.

The bezel area BZA may be an area having a relatively low light transmittance as compared with the transmissive area TA. The bezel area BZA defines a shape of the transmissive area TA. In an embodiment, the bezel area BZA may be adjacent to the transmissive area TA, and may surround the transmissive area TA (e.g., in the first and second directions DR1, DR2). The window 100 may include a light shielding pattern that is disposed in the base substrate and defines the bezel area BZA.

In an embodiment, the bezel area BZA may have a specific color. The bezel area BZA may prevent a peripheral area NAA of the display module 200 from being viewed from an outside while covering the peripheral area NAA. However, embodiments of the present disclosure are not necessarily limited thereto. For example, in the window 100 according to an embodiment of the present disclosure, the bezel area BZA may be reduced or omitted.

The display module 200 may generate the image IM (see FIG. 1A) and may detect an external input. In an embodiment, the front surface IS of the display module 200 includes an active area AA and the peripheral area NAA. The active area AA may be an area that is activated according to an electric signal. The active area AA and the peripheral area NAA may be defined in a display panel 210.

In the embodiment, the active area AA may be an area, in which the image IM is displayed, and also may be an area, in which an external input is sensed. The active area AA may correspond to the transmissive area TA, and the peripheral area NAA may correspond to the bezel area BZA. In the specification, the expression "an area/part and another area/part correspond to each other" means that "they at least partially overlap each other" (e.g., in the third direction DR3) and is not necessarily limited to having the same area and/or the same shape as each other.

Referring to FIGS. 1B and 1C, in an embodiment, the display module 200 includes the display panel 210, an input sensor 220, a driver circuit (or a driving circuit) DIC, and a circuit module FTC.

In an embodiment, the display panel 210 may be an organic light emitting display panel or an inorganic light emitting display panel. The panels are classified according to constituent materials of the light emitting elements. The light emitting layer of the organic light emitting display panel may include an organic light emitting material. In an embodiment, the light emitting layer of the inorganic light emitting display panel may include quantum dots and/or quantum rods. Hereinafter, the display panel 210 is described as an organic light emitting display panel for economy of description.

The input sensor 220 senses an external input that is applied from an outside. For example, in an embodiment, the external input may be an input through a touch of the user or a stylus pen. However, embodiments of the present disclosure are not necessarily limited thereto and the input may be sensed by proximity (e.g., hover of a user, stylus pen or other object), etc. In an embodiment, the input sensor 220 may be a capacitive touch sensor. However, embodiments of the present disclosure are not necessarily limited thereto.

The driver circuit DIC is disposed on the display panel 210. For example, in an embodiment, the driver circuit DIC may be mounted on (e.g., mounted directly thereon) the display panel 210. The driver circuit DIC is electrically connected to the display panel 210 to provide an electric signal for driving the display panel 210 to the display panel 210.

The circuit module FTC is electrically connected to the input sensor 220. In an embodiment, the circuit module FTC may include a flexible circuit board CF and a sensor driving circuit TIC. The flexible circuit board CF includes an insulating layer and a plurality of wiring lines. The wiring lines electrically connect the input sensor 220 and the sensor driving circuit TIC to each other. In an embodiment, the sensor driving circuit TIC may be mounted on the flexible circuit board CF in a form of a chip-on film.

The circuit module FTC may connect (e.g., electrically connect) the input sensor 220 and the display panel 210. However, embodiments of the present disclosure are not necessarily limited thereto. For example, in an embodiment, the sensor driving circuit TIC may be omitted. In an embodiment of the present disclosure, the sensor driving circuit TIC and the driver circuit DIC may be integrated.

Referring to FIG. 1C, in an embodiment, the display panel 210 may include the display substrate 210-B, an encapsulation substrate 210-U, and a sealing member SM that bonds the display substrate 210-B and the encapsulation substrate 210-U to each other. The display substrate 210-B includes pixels that substantially generate an image. The encapsulation substrate 210-U prevents the pixels from being damaged by external moisture, oxygen or other contaminants by sealing the pixels. In an embodiment, the input sensor 220 may be disposed directly on the encapsulation substrate 210-U.

The driver circuit DIC may be coupled to the display substrate 210-B. In an embodiment, the driver circuit DIC may be provided in a form of an integrated chip. However, embodiments of the present disclosure are not necessarily limited thereto. For example, in an embodiment of the present disclosure, the driver circuit DIC may not be disposed on the display substrate 210-B. In an embodiment, the driver circuit DIC may be mounted on a circuit board that is connected to the display substrate 210-B.

In an embodiment, the display substrate 210-B and the encapsulation substrate 210-U are base substrates, and may include glass substrates or plastic substrates. The display substrate 210-B and the encapsulation substrate 210-U may include glass substrates. The display substrate 210-B may have an area (e.g., in a plane defined in the first and second directions DR1, DR2) that is larger than that of the encapsulation substrate 210-U. In an embodiment, the driver circuit DIC may be disposed in a partial area of the display substrate 210-B, which is exposed from the encapsulation substrate 210-U. However, embodiments of the present disclosure are not necessarily limited thereto. For example, in an embodiment of the present disclosure, the display substrate 210-B and the encapsulation substrate 210-U may have the same area and the same shape as each other.

The sealing member SM, for example, may include frit. The frit is a ceramic adhesive material, and has a feature of being cured after exposure. In an embodiment, the frit contains about 15 to about 40 wt % of $V_2O_5$, about 10 to about 30 wt % of $TeO_2$, about 1 to about 15 wt % of $P_2O_5$, about 1 to about 15 wt % of BaO, about 1 to about 20 wt % of ZnO, about 5 to about 30 wt % of $ZrO_2$, and about 5 to about 20 wt % of $WO_3$, as main ingredients, and may include at least one of $Fe_2O_3$, CuO, MnO, $Al_2O_3$, $Na_2O$, or $Nb_2O_5$ as an additive. The sealing member SM overlaps the peripheral area NAA (e.g., in the third direction DR3).

Referring to FIG. 1D, in an embodiment the display substrate 210-B includes a base substrate 210-G, a circuit element layer 210-CL that is disposed on the base substrate 210-G (e.g., disposed directly thereon in the third direction DR3), and a display element layer 210-OLED that is disposed on the circuit element layer 210-CL (e.g., disposed directly thereon in the third direction DR3). The display substrate 210-B may further include a capping layer or an encapsulation layer that covers the display element layer 210-OLED.

In an embodiment, the base substrate 210-G may include a glass substrate, a metal substrate, or an organic/inorganic composite material substrate. The circuit element layer 210-CL includes at least one insulating layer and circuit elements. The insulating layer includes at least one inorganic layer and at least one organic layer. The circuit elements include signal lines and a pixel driving circuit. In an embodiment, the pixel driving circuit may be provided for each pixel. However, embodiments of the present disclosure are not necessarily limited thereto and the pixel driving circuit may be commonly disposed for a plurality of pixels. The display element layer 210-OLED may include light emitting elements OLED. In an embodiment, the light emitting elements OLED may be provided for each pixel. However, embodiments of the present disclosure are not necessarily limited thereto. The light emitting elements OLED may be switched on and off according to a control of the pixel driving circuit, and a light emission luminance thereof may be determined. In an embodiment, the light emitting elements OLED may include organic light emitting diodes.

FIGS. 2A to 2D are cross-sectional views illustrating a method for manufacturing the display module 200 according to an embodiment of the present disclosure.

Figure 2A:
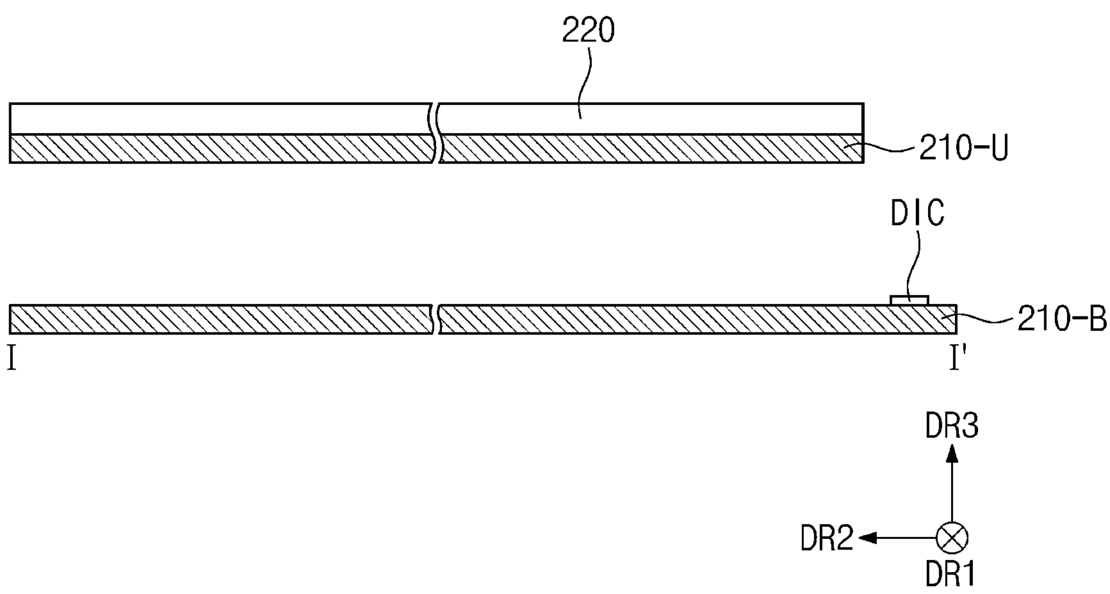
FIGS. 2A to 2D are cross-sectional views illustrating a method for manufacturing a display module according to embodiments of the present disclosure.

In an embodiment, as illustrated in FIG. 2A, the display substrate 210-B and the input sensor 220 are first prepared. Although the display substrate 210-B, on which the driver circuit DIC is mounted thereon in is illustrated FIG. 2A, embodiments of the present disclosure are not necessarily limited thereto. In an embodiment, the driver circuit DIC may be omitted, or the driver circuit DIC may be mounted on the display substrate 210-B after a manufacturing process that will be described below. The encapsulation substrate 210-U may be a base substrate, on which the input sensor 220 may be formed. The input sensor 220 is formed on (e.g., formed directly thereon) one surface of the encapsulation substrate 210-U, such as an upper surface (e.g., in the third direction DR3).

Figure 2B:
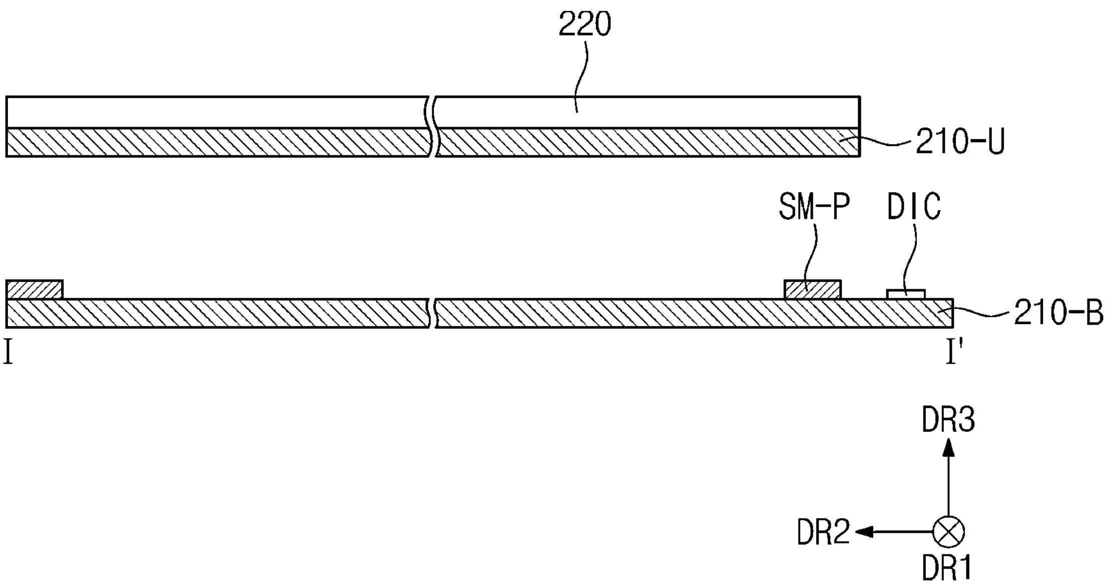

As illustrated in FIG. 2B, a sealing composite SM-P is provided between the display substrate 210-B and the encapsulation substrate 210-U (e.g., in the third direction DR3). In an embodiment, the sealing composite SM-P is provided in the peripheral area NAA of the circuit element layer 210-CL illustrated in FIG. 1D. Thereafter, the encapsulation substrate 210-U is arranged on the display substrate 210-B. One surface of the encapsulation substrate 210-U, such as a lower surface of the encapsulation substrate 210-U on which the input sensor 220 is not disposed, may face the sealing composite SM-P.

Figure 2C:
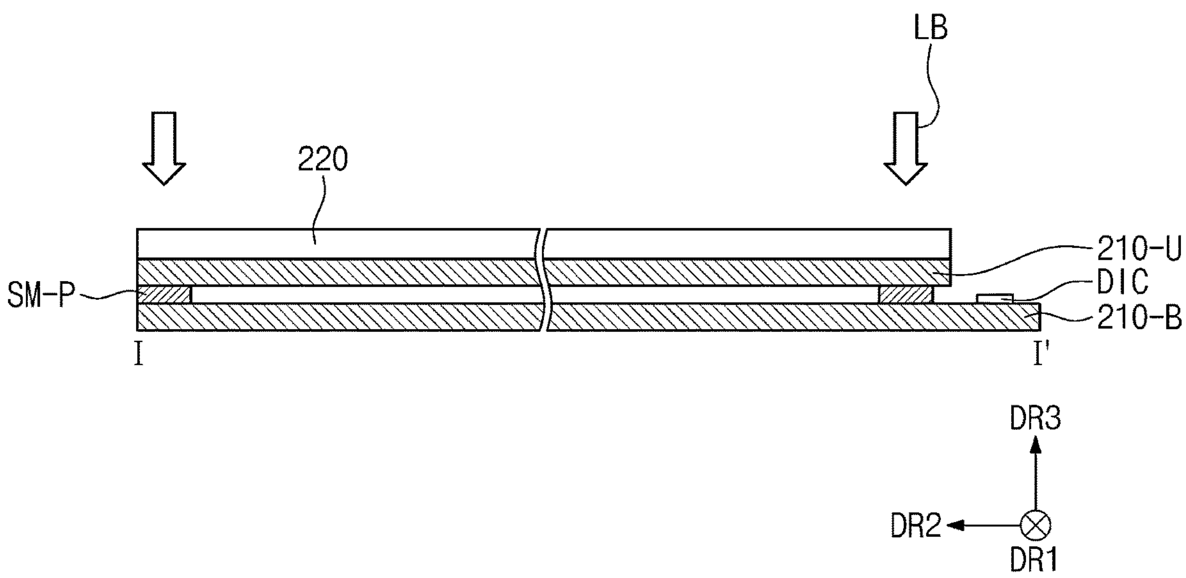

As illustrated in FIG. 2C, a laser beam LB is irradiated to the sealing composite SM-P from an upper side of the input sensor 220. The sealing composite SM-P that is exposed by the laser beam LB is cured.

Figure 2D:
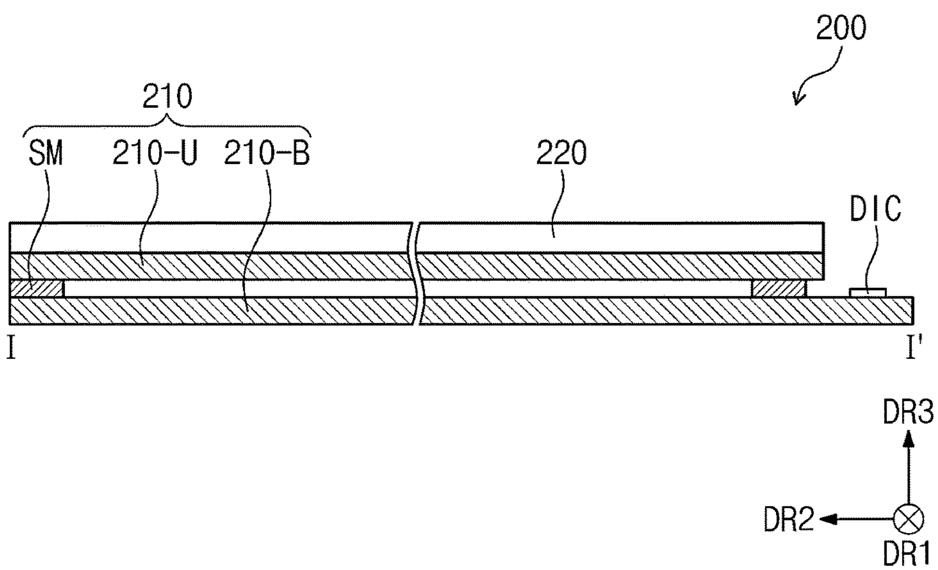

As illustrated in FIG. 2D, the cured sealing composite SM-P forms the sealing member SM. The sealing member SM protects organic light emitting diodes from external moisture, oxygen and other contaminants by sealing the display element layer 210-OLED of FIG. 1D with the encapsulation substrate 210-U.

Figure 3:
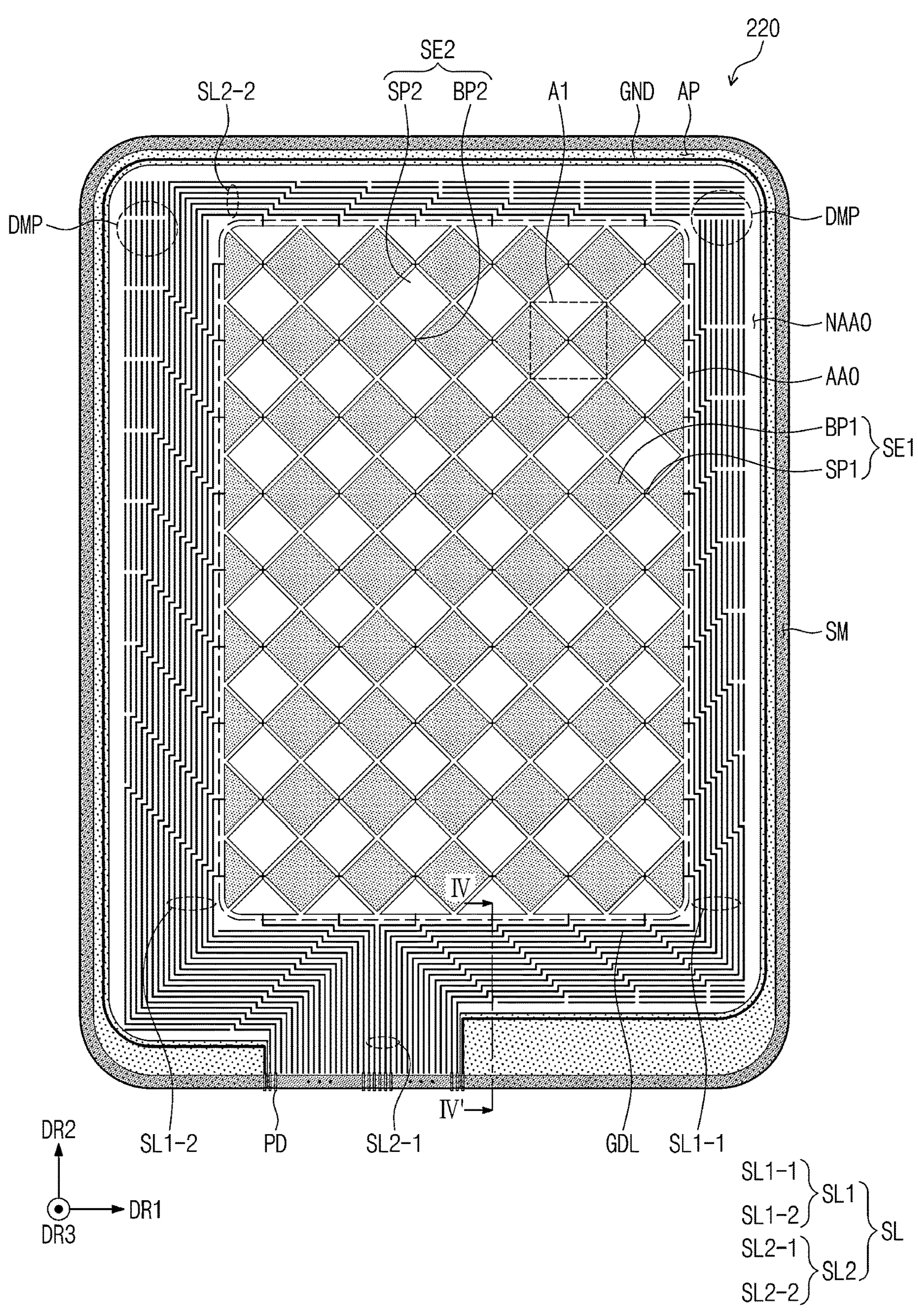
FIG. 3 is a plan view of an input sensor according to an embodiment of the present disclosure.

FIG. 3 is a plan view of the input sensor 220 according to an embodiment of the present disclosure. A sensing area AA0 and a non-sensing area NAA0 of the input sensor 220, which correspond to the active area AA and the peripheral area NAA of the display panel 210 of FIG. 1B are illustrated in FIG. 3. The sensing area AA0 and the non-sensing area NAA0 are defined on an upper surface of the encapsulation substrate 210-U of FIG. 1C. For convenience of description, FIG. 3 illustrates a planar disposition of the sealing member SM included in the above-described display panel 210 (see FIG. 1C). However, embodiments of the present disclosure are not necessarily limited thereto.

The input sensor 220 includes a plurality of sensing electrodes SE1 and SE2, and a plurality of signal lines SL that are connected to the plurality of sensing electrodes SE1 and SE2. The input sensor 220 further includes a ground line GND and an additional electrode AP that are disposed in the non-sensing area NAA0.

The sensing electrodes SE1 and SE2 are disposed in the sensing area AA0. In an embodiment, the sensing electrodes SE1 and SE2 may include a plurality of first sensing electrodes SE1 and a plurality of second sensing electrodes SE2, which cross each other.

In an embodiment, the first sensing electrodes SE1 may extend along the first direction DR1, and may be arranged along the second direction DR2. In an embodiment, each of the first sensing electrodes SE1 may include a plurality of first sensing patterns SP1 (hereinafter, sensing parts of a first group) and a plurality of middle parts BP1 (hereinafter, middle parts of the first group), which are arranged along the first direction DR1. In an embodiment, the second sensing electrodes SE2 may extend along the second direction DR2, and may be arranged along the first direction DR1. In an embodiment, each of the second sensing electrodes SE2 may include a plurality of second sensing patterns SP2 (hereinafter, sensing parts of a second group) and a plurality of middle parts BP2 (hereinafter, middle parts of the second group), which are arranged along the second direction DR2.

The above-described terms of "the first sensing electrodes SE1 and the second sensing electrodes SE2" are terms that are defined to distinguish two kinds of electrodes. However, in an embodiment of the present disclosure, the electrodes that extend along the first direction DR1 may be defined as second sensing electrodes, and the electrodes that extend along the second direction DR2 may be defined as first sensing electrodes. In an embodiment of the present disclosure, the input sensor 220 may include only one kind of sensing electrode. The input sensor 220 may sense an external input in a self-cap (e.g., a self-capacitive) scheme.

The signal lines SL are disposed in the non-sensing area NAA0. In an embodiment, the signal lines SL may include a plurality of first signal lines SL1 and a plurality of second signal lines SL2. In an embodiment, the plurality of first signal lines SL1 may include (1-1)-th signal lines SL1-1 and (1-2)-th signal lines SL1-2, and the plurality of second signal lines SL2 may include (2-1)-th signal lines SL2-1 and (2-2)-th signal lines SL2-2. The above-described terms of "the first signal lines SL1 and the second signal lines SL2" are terms that are defined to distinguish two kinds of signal lines. However, the second signal lines SL2 may be defined as first signal lines and the first signal lines SL1 may be defined as second signal lines. Pads PD are connected to distal ends of the signal lines SL, respectively. As illustrated in FIG. 3, the pads PD may be arranged along the first direction DR1.

The first signal lines SL1 are electrically connected to opposite ends of the first sensing electrodes SE1. The second signal lines SL2 are electrically connected to opposite ends of the second sensing electrodes SE2. The (1-1)-th signal lines SL1-1 may be electrically connected to ones (e.g., right ends in the first direction DR1) of opposite ends of the first sensing electrodes SE1, respectively, and the (1-2)-th signal lines SL1-2 may be electrically connected to opposite ones (e.g., left ends in the first direction DR1) of the opposite ends of the first sensing electrodes SE1, respectively. The (2-1)-th signal lines SL2-1 may be electrically connected to ones (e.g., lower ends in the second direction DR2) of opposite ends of the second sensing electrodes SE2, respectively, and the (2-2)-th signal lines SL2-2 may be electrically connected to opposite ones (e.g., upper ends in the second direction DR2) of the opposite ends of the second sensing electrodes SE2, respectively. As will be described below, the signal lines SL may be disposed on different layers from the corresponding sensing electrodes SE1 and SE2. The expression that "the above-described signal lines are electrically connected to the corresponding sensing electrodes" means that the sensing electrodes corresponding to the signal lines and the signal lines have an integral shape or directly contact each other through contact holes that pass through the insulating layer.

However, a connection relationship between the sensing electrodes SE1 and SE2 and the signal lines SL is not necessarily limited to the above description. According to an embodiment, at least any one of the (1-2)-th signal lines SL1-2 and the (2-2)-th signal lines SL2-2 may be omitted.

According to an embodiment, the second sensing electrodes SE2 may receive the driving signals through the (2-1)-th signal lines SL2-1 and the (2-2)-th signal lines SL2-2, respectively (hereinafter, a TX electrode function). The sensor driving circuit TIC (see FIG. 1B) may receive sensing signals through the (1-1)-th signal lines SL1-1 and the (1-2)-th signal lines SL1-2 (hereinafter, an RX electrode function). The sensor driving circuit TIC may measure changes in mutual capacitances between the first sensing electrodes SE1 and the second sensing electrodes SE2 through sensing signals. However, embodiments of the present disclosure are not necessarily limited thereto, and the TX electrode function of the first sensing electrodes SE1 and the RX electrode function of the second sensing electrodes SE2 may be changed. For example, in an embodiment of the present disclosure, the (1-1)-th signal lines SL1-1 and the (1-2)-th signal lines SL1-2 may receive driving signals, respectively.

In an embodiment, the ground line GND receives a ground voltage and is disposed at an outskirt of (e.g., a periphery of) the non-sensing area NAA0. As illustrated in FIG. 3, the ground line GND may be disposed to be more spaced apart from the sensing area AA0 (e.g., in the first and/or second directions DR1, DR2) than the plurality of signal lines SL. For example, the ground line GND may be disposed at an outskirt of (e.g., a periphery of) the non-sensing area NAA0 as compared with the plurality of signal lines SL. The plurality of signal lines SL may be disposed between the ground line GND and the sensing electrodes SE1 and SE2 on a plane (e.g., in the first and/or second directions DR1, DR2). A ground voltage may be applied to the ground line GND to reduce electromagnetic interferences that are generated in the plurality of signal lines SL and the sensing electrodes SE1 and SE2.

The input sensor 220 of an embodiment may further include dummy patterns DMP. The dummy patterns DMP may be disposed between the signal lines SL and the ground line GND (e.g., in the first and/or second directions DR1, DR2), and a width of a wiring line area SGA (see FIG. 5), in which the signal lines SL and the ground line GND are disposed, may be adjusted to be constant. In an embodiment, the dummy patterns DMP may be disposed on the same layer as that of the signal lines SL, and may be spaced apart from the signal lines SL and the ground line GND (e.g., in the first and/or second directions DR1, DR2). In an embodiment, the dummy patterns DMP may be formed through the same process as that for the signal lines SL, and may include the same material. For example, the dummy patterns DMP may include a low-resistance metal. The dummy patterns DMP may be an electrically isolated floating pattern. However, embodiments of the present disclosure are not necessarily limited thereto and the dummy patterns DMP may be omitted in some embodiments.

The input sensor 220 of an embodiment may further include a guard line GDL. The guard line GDL may be disposed between each of the signal lines SL and the ground line GND and the dummy patterns DMP, or may be disposed between ones of the plurality of first signal lines SL1 and the plurality of second signal lines SL2, which are disposed to be adjacent to each other. The guard line GDL may decrease a parasite capacitance between two lines that are disposed to be adjacent to each other.

The sealing member SM is disposed on an outside of the signal lines SL and the ground line GND on a plane (e.g., in the first and/or second directions DR1, DR2). To decrease an area of the non-sensing area NAA0, the sealing member SM may overlap the pads PD. Since the sealing member SM, as described above, is formed by curing the sealing composite SM-P (see FIG. 2C) with the laser beam LB (see FIG. 2C), the sealing member SM may not overlap the signal lines SL including a reflective metal and the ground line GND on a plane.

The input sensor 220 includes the additional electrode AP that overlaps at least a portion of the sealing member SM on a plane (e.g., in the third direction DR3). The additional electrode AP is electrically connected to the ground line GND. The additional electrode AP may be electrically insulated from the signal lines SL. The additional electrode AP may overlap at least a portion of the ground line GND on a plane (e.g., in the third direction DR3), and may be electrically connected to the ground line GND whereby the additional electrode AP also may receive a ground voltage. For example, as illustrated in FIG. 3, a remaining portion of the additional electrode AP, except for an area in which the pads PD are disposed, may be disposed to overlap the sealing member SM (e.g., in the third direction DR3).

The additional electrode AP overlaps the sealing member SM on a plane (e.g., in the third direction DR3). Since the additional electrode AP includes a material that transmits light, unlike the signal lines SL and the ground line GND, the laser beam LB (see FIG. 2C) may pass through the additional electrode AP to cure the sealing composite SM-P (see FIG. 2C) even though the additional electrode AP overlaps the sealing composite SM-P (see FIG. 2C) in a process of forming the sealing member SM.

Figure 4A:
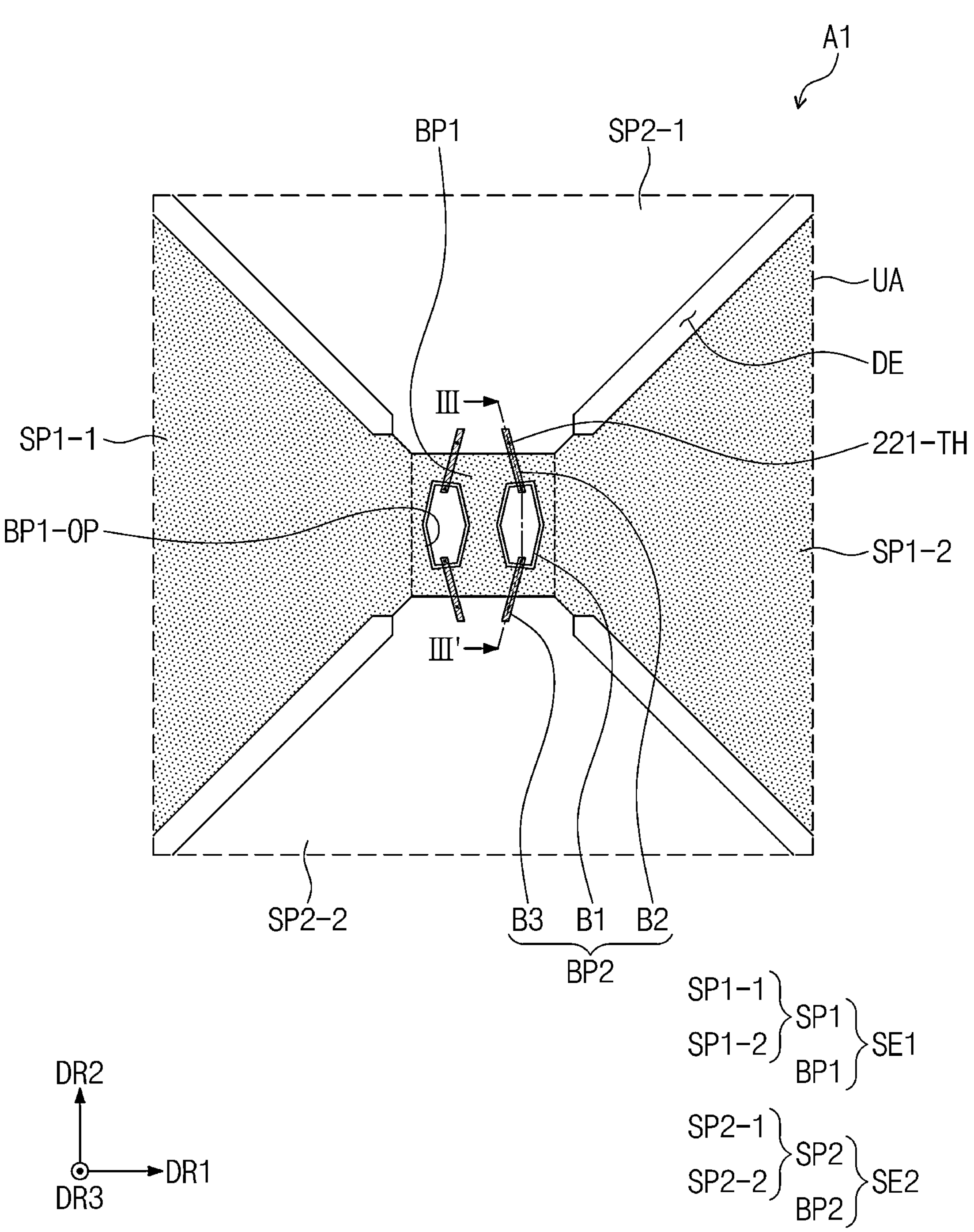
FIG. 4A is a plan view of a portion of an input sensor according to an embodiment of the present disclosure.
Figure 4B:
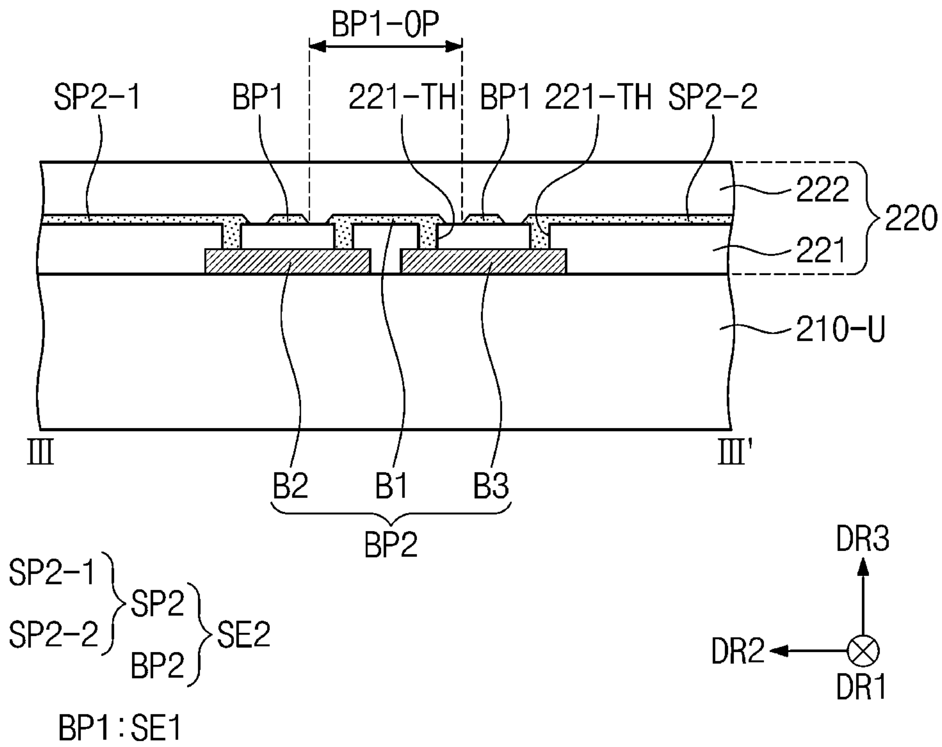
FIG. 4B is a cross-sectional view of a portion of an input sensor taken along line III-III' of FIG. 4A according to an embodiment of the present disclosure.

FIG. 4A is a plan view of a portion of the input sensor 220 according to an embodiment of the present disclosure. FIG. 4B is a cross-sectional view of a portion of the input sensor 220 according to an embodiment of the present disclosure. FIG. 4A is a plan view of a first area A1 of FIG. 3. FIG. 4B is a cross-sectional view corresponding to line III-III' of FIG. 4A. Hereinafter, structures of the sensing electrodes SE1 and SE2 of the input sensor 220 will be described in detail with reference to FIG. 3.

As illustrated in FIGS. 4A and 4B, the first area A1 corresponds to one unit area UA. In an embodiment, the sensing area AA0 of FIG. 3 may include a plurality of unit areas UA of FIGS. 4A and 4B. A crossing area of the first sensing electrode SE1 and the second sensing electrode SE2 are disposed in each of the unit areas UA.

In an embodiment, any one of the first sensing electrode SE and the second sensing electrode SE2 may have an integral shape, and the other one may include a plurality of patterns that are spaced apart from each other. In an embodiment shown in FIG. 4A, the first sensing electrode SE1 having an integral shape is illustrated as an example. Among the groups of the sensing parts and the middle parts of the first group and the sensing parts and the middle parts of the second group, which have been described with reference to FIG. 3, the ones of the group having the integral shape will be described as sensing patterns and middle parts, and the ones of the group having no integral shape will be described as sensing patterns and bridges hereinafter.

In an embodiment as shown in FIG. 4A, the second sensing electrode SE2 may include the plurality of second sensing patterns SP2 and bridges BP2 that are disposed between the adjacent second sensing patterns SP2 to electrically connect the adjacent second sensing patterns SP2. One of the adjacent two sensing patterns may be defined as a second first sensing pattern SP2-1, and the other one may be defined as a second sensing pattern SP2-2. The second first sensing pattern SP2-1 and the second second sensing pattern SP2-2 are disposed to be spaced apart from each other in the second direction DR2.

The first sensing electrode SE1 may include the plurality of first sensing patterns SP1 and middle parts BP1 that are disposed between the adjacent first sensing patterns SP1 (e.g., in the first direction DR1) to electrically connect the adjacent first sensing patterns SP1. One of the adjacent two first sensing patterns SP1 may be defined as a first first sensing pattern SP1-1, and the other may be defined as a first second sensing pattern SP1-2. The middle part BP1 is disposed between the first first sensing pattern SP1-1 and the first second sensing pattern SP1-2 in the first direction DR1. In an embodiment as shown in FIG. 4A, since the first first sensing pattern SP1-1, the first second sensing pattern SP1-2, and the middle part BP1 have an integral shape, a border thereof is not distinguished. According to an embodiment, a portion of the first sensing electrode SE1 disposed between the second first sensing pattern SP2-1 and the second second sensing pattern SP2-2 in the second direction DR2 may be defined as the middle part BP1. In FIG. 4A, a border line of the middle part BP1 of the first first sensing pattern SP1-1 and the first second sensing pattern SP1-2 is indicated by a dotted line.

FIG. 4A illustrates two bridges BP2. However, the number of bridges BP2 in the unit area UA is not necessarily limited thereto and three or more bridges BP2 may be included in the unit area UA. In an embodiment the bridges BP2 may include a first bridge pattern B1, a second bridge pattern B2, and a third bridge pattern B3. Each of the first bridge pattern B1, the second bridge pattern B2, and the third bridge pattern B3 may be a conductive pattern. In an embodiment, the first bridge pattern B1 may be disposed on a layer that is different from those of the second bridge pattern B2 and the third bridge pattern B3. For example, in an embodiment the first bridge pattern B1 may be disposed on the same layer as that of the second sensing pattern SP2. The first bridge pattern B1 is disposed on an inside of an opening BP1-OP that is defined in the middle part BP1.

However, embodiments of the present disclosure are not necessarily limited thereto and the configuration of the bridge BP2 may vary. For example, in an embodiment of the present disclosure, the bridge BP2 may include only one of the second bridge pattern B2 or the third bridge pattern B3. One bridge pattern may be disposed on a layer that is different from those of the second first sensing pattern SP2-1 and the second second sensing pattern SP2-2, and the bridge pattern may be directly connected to the second first sensing pattern SP2-1 and the second second sensing pattern SP2-2.

Dummy electrodes DE may be disposed between the second first sensing pattern SP2-1 and the first first sensing pattern SP1-1, between the second first sensing pattern SP2-1 and the first second sensing pattern SP1-2, between the second second sensing pattern SP2-2 and the first first sensing pattern SP1-1, and between the second second sensing pattern SP2-2 and the first second sensing pattern SP1-2, respectively. The dummy electrodes DE may be electrically isolated floating patterns. However, embodiments of the present disclosure are not necessarily limited thereto and the dummy electrodes DE may be omitted in some embodiments.

FIG. 4A illustrates borders of the second first sensing pattern SP2-1, the second second sensing pattern SP2-2, the first first sensing pattern SP1-1, and the first second sensing pattern SP1-2, and the dummy electrodes DE with only border lines, and the borders are not illustrated in detail. However, the border lines briefly indicate that adjacent two configurations of the second first sensing pattern SP2-1, the second second sensing pattern SP2-2, the first first sensing pattern SP1-1, the first second sensing pattern SP1-2, and the dummy electrodes DE are disposed to be spaced apart from each other.

As illustrated in FIG. 4B, in an embodiment the second bridge pattern B2 and the third bridge pattern B3 are disposed on (e.g., disposed directly thereon) the encapsulation substrate 210-U. In an embodiment, the second bridge pattern B2 and the third bridge pattern B3 may include a low-resistance metal.

At least one insulating layer is disposed on an upper surface of the encapsulation substrate 210-U. In an embodiment, a first insulating layer 221 may cover the second bridge pattern B2 and the third bridge pattern B3. In an embodiment, the second first sensing pattern SP2-1 and the second second sensing pattern SP2-2 are disposed on (e.g., disposed directly above) the first insulating layer 221. The middle part BP1 is disposed between the second first sensing pattern SP2-1 and the second second sensing pattern SP2-2 (e.g., in the second direction DR2). The first bridge pattern B1 is disposed in the opening BP1-OP of the middle part BP1.

Through contact holes 221-TH that pass through the first insulating layer 221, the second first sensing pattern SP2-1 and the first bridge pattern B1 directly contact the second bridge pattern B2. Through the contact holes 221-TH that pass through the first insulating layer 221, the first bridge pattern B1 and the second second sensing pattern SP2-2 directly contact the third bridge pattern B3.

In an embodiment, the second first sensing pattern SP2-1, the second second sensing pattern SP2-2, the first first sensing pattern SP1-1, the first second sensing pattern SP1-2, and the first bridge pattern B1 of FIGS. 4A and 4B may be formed through the same photolithography process, and may include the same material as each other. For example, in an embodiment the second first sensing pattern SP2-1, the second second sensing pattern SP2-2, the first first sensing pattern SP1-1, the first second sensing pattern SP1-2, and the first bridge pattern B1 may include a transparent conductive oxide (TCO). In an embodiment, the second first sensing pattern SP2-1, the second second sensing pattern SP2-2, the first first sensing pattern SP1-1, the first second sensing pattern SP1-2, and the bridge pattern B1 may include an indium tin oxide (ITO), an indium zinc oxide (IZO), a zinc oxide (ZnO), or an indium tin zinc oxide (ITZO). In an embodiment, thicknesses (e.g., lengths in the third direction DR3) of the second first sensing pattern SP2-1, the second second sensing pattern SP2-2, the first first sensing pattern SP1-1, the first second sensing pattern SP1-2, and the first bridge pattern B1 may be in a range of about 700 to 100 angstroms. Since the second first sensing pattern SP2-1, the s second second sensing pattern SP2-2, the first first sensing pattern SP1-1, and the first second sensing pattern SP1-2 includes a transparent conductive oxide, degradation of the light emission luminance may be prevented even though the sensing electrodes SE1 and SE2 of FIG. 3 overlap, among the light emitting elements OLED illustrated in FIG. 1D, the corresponding light emitting elements OLED. In an embodiment of the present disclosure, the second first sensing pattern SP2-1, the second second sensing pattern SP2-2, the first first sensing pattern SP1-1, the first second sensing pattern SP1-2, and the bridge pattern B1 may include PEDOT, a metal nano wire, or graphene.

Figure 5:
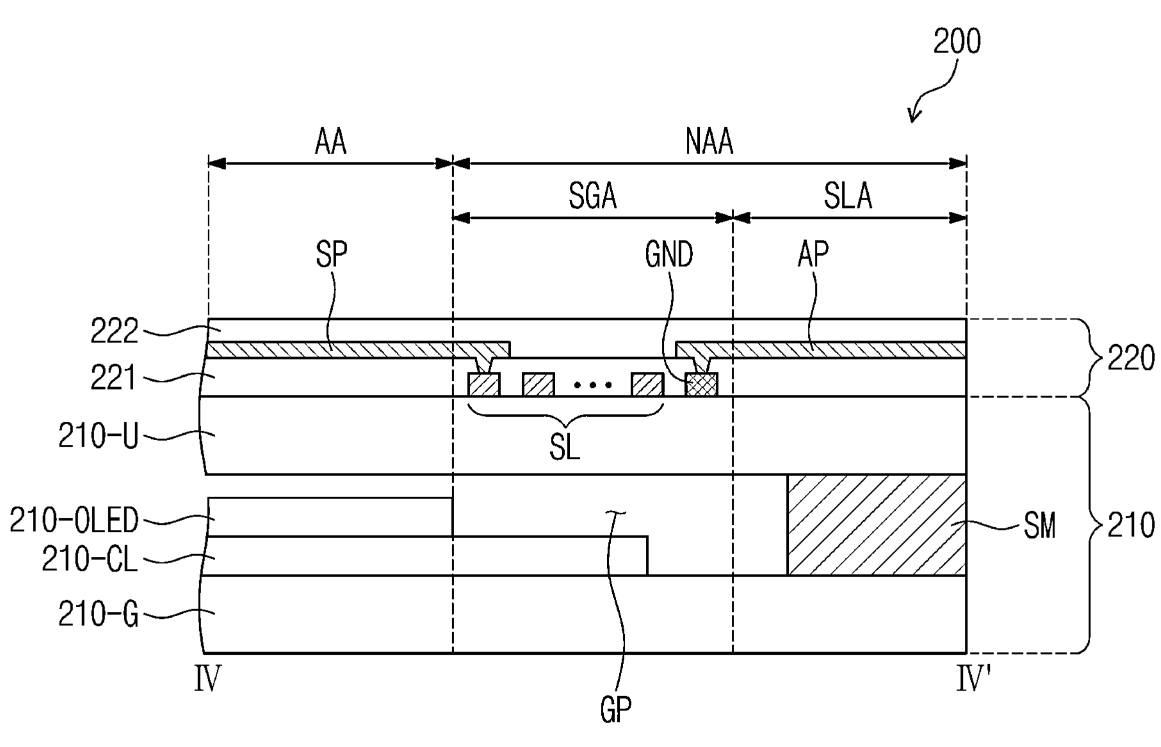
FIG. 5 is a cross-sectional view of a display module taken along line IV-IV' of FIG. 3 according to an embodiment of the present disclosure.

As illustrated in FIG. 4B, in an embodiment a second insulating layer 222 is disposed on the first insulating layer 221. The second insulating layer 222 may cover the second first sensing pattern SP2-1, the second second sensing pattern SP2-2, the middle part BP1, and the first bridge pattern B1. The first insulating layer 221 and the second insulating layer 222 may include an inorganic material or an organic material. In an embodiment, the first insulating layer 221 and the second insulating layer 222 may include a silicon oxide, a silicon nitride, or a silicon oxynitride. In an embodiment, the first insulating layer 221 and the second insulating layer 222 may be silicon oxide having layers of a thickness in a range of 2500 to 3500 angstroms. In an embodiment, an organic layer may be further disposed between an upper surface of the encapsulation substrate 210-U, and the second bridge pattern B2 and the third bridge pattern B3. FIG. 5 is a cross-sectional view of the display module 200 according to an embodiment of the present disclosure. FIG. 5 illustrates a cross-section corresponding to the line IV-IV' of FIG. 3.

Referring to FIGS. 3 and 5, the display module 200 may include the display panel 210 and the input sensor 220, and the display panel 210 includes the display substrate 210-B, the encapsulation substrate 210-U, and a sealing member SM that bonds the display substrate 210-B and the encapsulation substrate 210-U to each other.

In an embodiment, the display substrate 210-B includes the base substrate 210-G, the circuit element layer 210-CL that is disposed on (e.g., disposed directly thereon) the base substrate 210-G, and the display element layer 210-OLED that is disposed on (e.g., disposed directly thereon) the circuit element layer 210-CL. The active area AA of the display panel 210 may correspond to an area, in which the display element layer 210-OLED is disposed, and the peripheral area NAA may correspond to an area that does not overlap the display element layer 210-OLED (e.g., in the third direction DR3). In an embodiment, the active area AA of the display panel 210 may correspond to the sensing area AA0 of the input sensor 220, and the peripheral area NAA of the display panel 210 may correspond to the non-sensing area NAA0. In an embodiment, a specific gap GP may be defined between the display substrate 210-B and the encapsulation substrate 210-U (e.g., in the third direction DR3).

In the display module 200 of an embodiment, one side of the sealing member SM may define surfaces that are aligned with the base substrate 210-G and the encapsulation substrate 210-U, respectively. For example, one side of the sealing member SM, one side of the base substrate 210-G, and one side of the encapsulation substrate 210-U may define one aligned surface that extends in the third direction DR3. One side of the encapsulation substrate 210-U does not protrude from one side of the sealing member SM. However, embodiments of the present disclosure are not necessarily limited thereto, and in an embodiment, the encapsulation substrate 210-U may include an extension part that protrudes from one side of the sealing member SM.

The input sensor 220 may include the sensing pattern SP, the plurality of signal lines SL, the ground line GND, and the additional electrode AP.

The sensing pattern SP may be any one of the sensing patterns SP1 and SP2 included in the sensing electrodes SE1 and SE2 described in FIG. 3. In an embodiment, the sensing pattern SP may include a transparent conductive oxide. The sensing pattern SP may be disposed in the active area AA.

The plurality of signal lines SL and the ground line GND are disposed in the peripheral area NAA. Each of the signal lines SL may be electrically connected to the corresponding sensing pattern SP. In an embodiment, the peripheral area NAA may include a wiring line area SGA in which the signal lines SL and the ground line GND are disposed, and a sealing area SLA that overlaps the sealing member SM (e.g., in the third direction DR3). The plurality of signal lines SL and the ground line GND overlap the wiring line area SGA (e.g., in the third direction DR3), and may not overlap the sealing area SLA (e.g., in the third direction DR3).

As illustrated in FIG. 5, in an embodiment the ground line GND may be disposed at an outermost side of the wiring line area SGA. For example, the ground line GND may be disposed at an outskirt (e.g., a periphery) of the wiring line area SGA as compared with the signal lines SL. The ground line GND may be spaced apart from the active area AA with the signal lines SL being interposed therebetween.

The input sensor 220 includes the additional electrode AP, and the additional electrode AP overlaps the sealing member SM (e.g., in the third direction DR3). The additional electrode AP may be disposed in the sealing area SLA, and may be electrically connected to the ground line GND.

The input sensor 220 may include at least one insulating layer. For example, in an embodiment the input sensor 220 may include the first insulating layer 221 that is disposed on (e.g., disposed directly thereon) the encapsulation substrate 210-U, and the second insulating layer 222 that is disposed on the first insulating layer 221.

In an embodiment, the sensing pattern SP and the additional electrode AP may be disposed on the same layer as each other. In an embodiment, the sensing pattern SP and the additional electrode AP may include the same material, and may be formed through the same process. In an embodiment, the sensing pattern SP and the additional electrode AP may be disposed on (e.g., disposed directly above) the first insulating layer 221, and may be covered by the second insulating layer 222. In an embodiment, the sensing pattern SP and the additional electrode AP may include a transparent conductive oxide.

In an embodiment, the signal lines SL and the ground line GND may be disposed on the same layer as each other. In an embodiment, the signal lines SL and the ground line GND may include the same material, and may be formed through the same process. The signal lines SL and the ground line GND may be disposed on (e.g., disposed directly thereon) the encapsulation substrate 210-U, and may be covered by the first insulating layer 221. For example, the signal lines SL and the ground line GND may be disposed under the first insulating layer 221. The signal lines SL and the ground line GND may include a low-resistance metal.

In an embodiment, the sensing pattern SP may be connected to (e.g., directly connected thereto) the corresponding one of the signal lines SL through a contact hole that passes through the first insulating layer 221. In an embodiment, the additional electrode AP may be connected to (e.g., directly physically connected and electrically connected thereto) the ground line GND through a contact hole that passes through the first insulating layer 221. The additional electrode AP may be connected to the ground line GND, and may receive a ground voltage. The additional electrode AP may not overlap the signal lines SL on a plane (e.g., in a third direction DR3).

In an embodiment, the first and second insulating layers 221 and 222 included in the input sensor 220 may not overlap the wiring line area SGA and the sealing area SLA. In an embodiment in which the first and second insulating layers 221 and 222 do not overlap the wiring line area SGA and the sealing area SLA, a portion of the sensing pattern SP may be disposed on and connected to a corresponding one of the signal lines SL with no separate contact hole. When the insulating layers 221 and 222 do not overlap the wiring line area SGA and the sealing area SLA, a portion of the additional electrode AP may be disposed on, and connected to (e.g., directly electrically connected and physically connected thereto), the ground line GND without a separate contact hole.

The input sensor according to an embodiment may include the ground line for decreasing the electromagnetic interferences that are generated in the signal lines and the sensing electrodes, and may increase an area of the conductive pattern, to which a ground voltage is applied, through the additional electrode connected to the ground line to decrease scattering of the capacitances between the signal lines and the sensing electrodes, thereby increasing an electromagnetic interference decreasing effect. In an embodiment in which the additional electrode includes a light transmitting material, such as a transparent conductive oxide, a process of curing the sealing member by a laser beam is not hindered even though the additional electrode is disposed to overlap the sealing member whereby a process performance of the display device including the input sensor may be increased.

In more detail, electromagnetic interferences of the sensing electrodes included in the input sensor and the signal lines connected thereto may be removed through electromagnetic interference cancellation driving through phases of the sensing electrodes and the signal lines, and the electromagnetic interference cancellation driving may not be smoothly performed when the differences between the capacitances of the adjacent sensing electrode and signal lines are large. However, since the input sensor according to an embodiment may increase an area of the conductive pattern, to which the ground voltage is applied through the additional electrode connected to the ground line, it may decrease the differences between the capacitances of the adjacent sensing electrodes and signal lines, thereby smoothly performing the electromagnetic interference cancellation driving. Accordingly, the electromagnetic interference decreasing effect of the input sensor may be increased, and the sensing performances of the input sensor and the display device including the same may be increased.

Figure 6A:
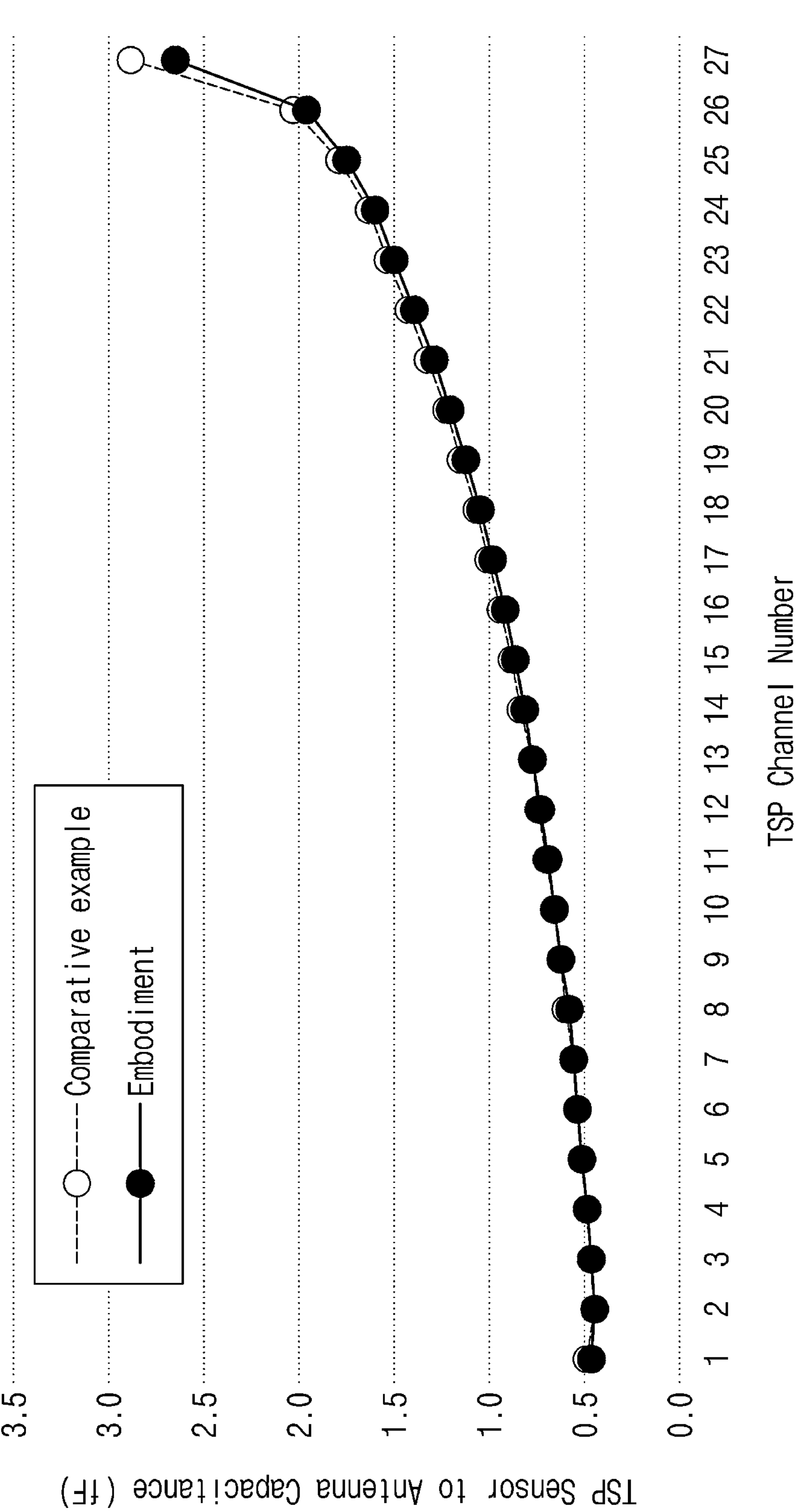
FIG. 6A is a graph depicting capacitances of antennas to sensing patterns for respective channels of an input sensor according to an embodiment of the present disclosure and an input sensor of a comparative example.
Figure 6B:
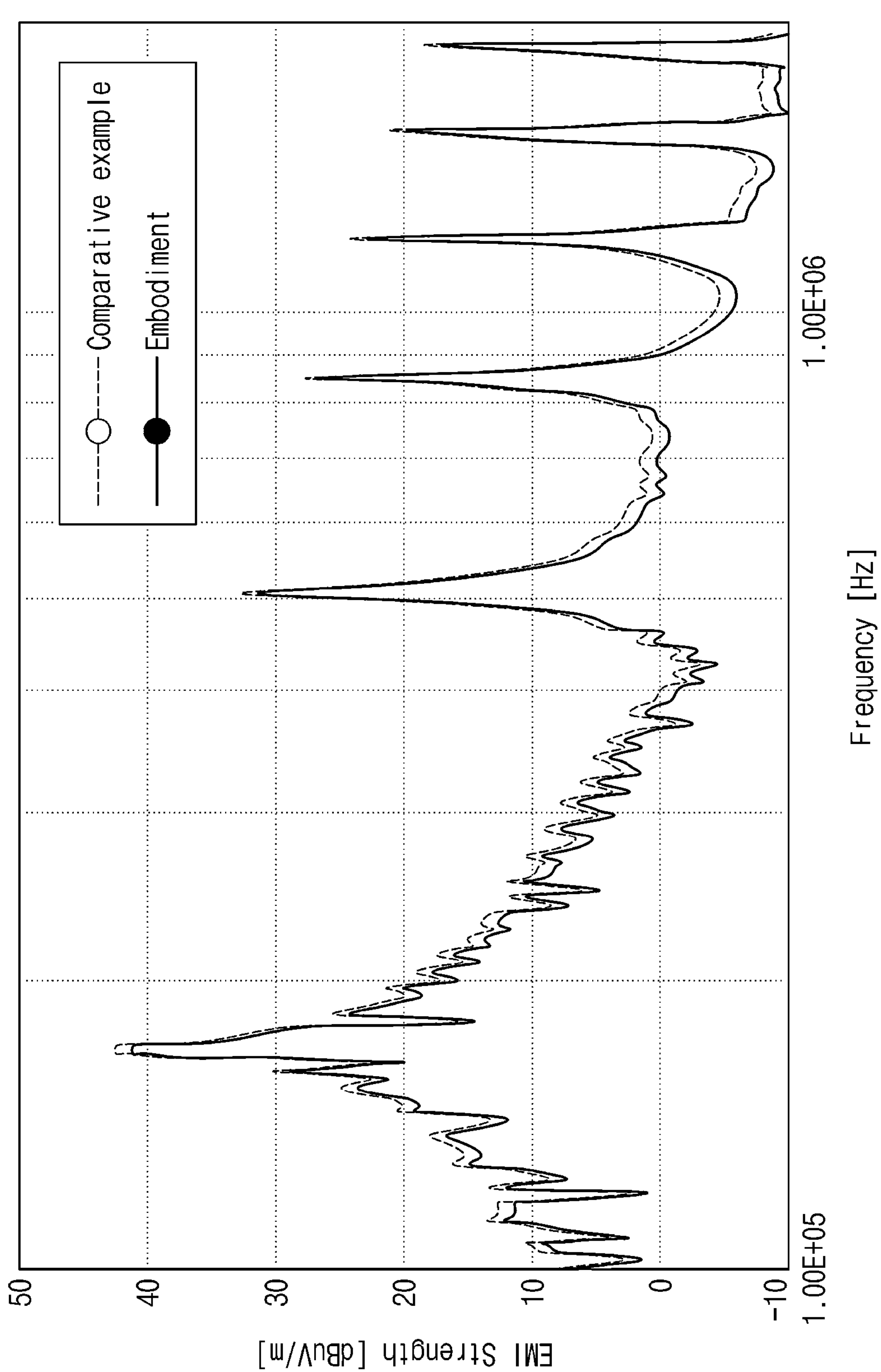
FIG. 6B is a graph depicting intensities of electromagnetic interferences for frequencies of an input sensor according to an embodiment of the present disclosure and an input sensor of a comparative example.

FIG. 6A is a graph depicting capacitances of antennas to sensing patterns antennas for respective channels of the input sensor according to an embodiment of the present disclosure and an input sensor of a comparative example. FIG. 6B is a graph depicting intensities of electromagnetic interferences for frequencies of the input sensor according to an embodiment of the present disclosure and the input sensor of a comparative example.

In FIG. 6A, "a channel" indicates one sensing electrode and one signal line that is connected thereto. FIG. 6A illustrates a simulation result obtained by measuring differences of capacitances between an antenna for measuring an EMI and channels in the input sensors of an embodiment of the present disclosure and the comparative example, and, among a total of 27 channels, No. 1 channel corresponds to a channel that is closest to a ground surface and No. 27 channel corresponds to a channel that is most distant from the ground surface. The input sensor of an embodiment of the present disclosure is an input sensor including the additional electrode described above in FIGS. 3 and 5, and the input sensor of the comparative example is an input sensor, in which the additional electrode is excluded from the input sensor of the embodiment. FIG. 6B illustrates a simulation result obtained by measuring electromagnetic interference intensities for frequencies in the input sensors of an embodiment of the present disclosure and the comparative example during mutual driving.

Referring to the results of FIGS. 6A and 6B, the electromagnetic interference intensities of the input sensor of the embodiment for frequencies were lower than those of the input sensor of the comparative example, and it may be identified that the electromagnetic interference intensity was decreased at a frequency having a peak point having the highest electromagnetic interference intensity. Furthermore, it may be identified that, in the input sensor of the comparative example, a difference of capacitances between Nos. 25 to 27 channels that are distant from the ground surface was large, but compared with the input sensor of the comparative example, in the input sensor of the embodiment, a deviation of the differences of the capacitances between Nos. 25 to 27 channels that are spaced apart from the ground surface was decreased. It may be identified through the simulation results of FIGS. 6A and 6B that the input sensor of an embodiment increased an area of the conductive pattern, to which the ground voltage is applied, through the additional electrode connected to the ground line, and thus a difference of the capacitances between the channels that are spaced apart a large amount from the ground surface was decreased and thus, electromagnetic interference cancellation driving between the adjacent channels was smoothly performed whereby the electromagnetic interference intensity was decreased.

Figure 7:
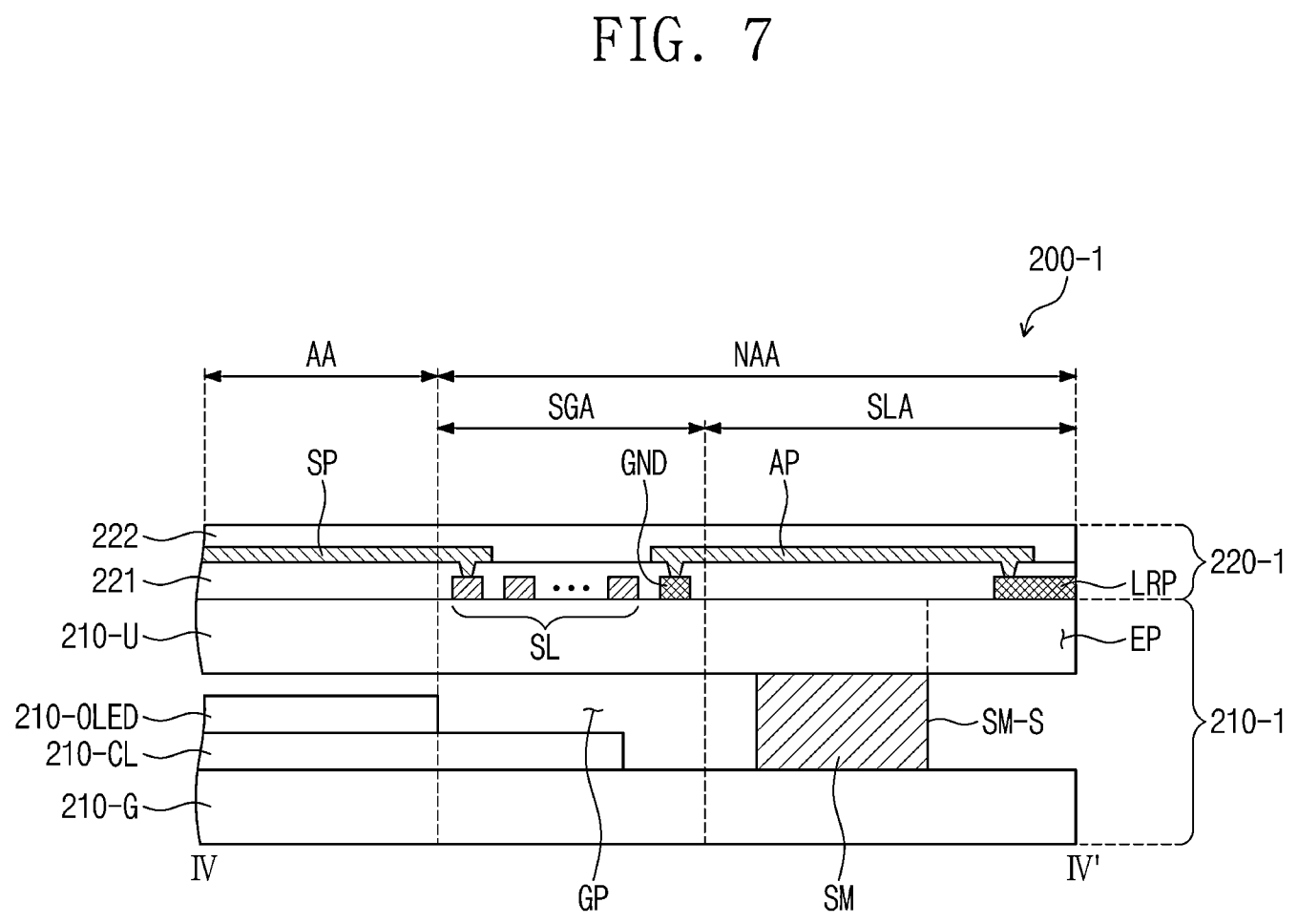
Figure 8:
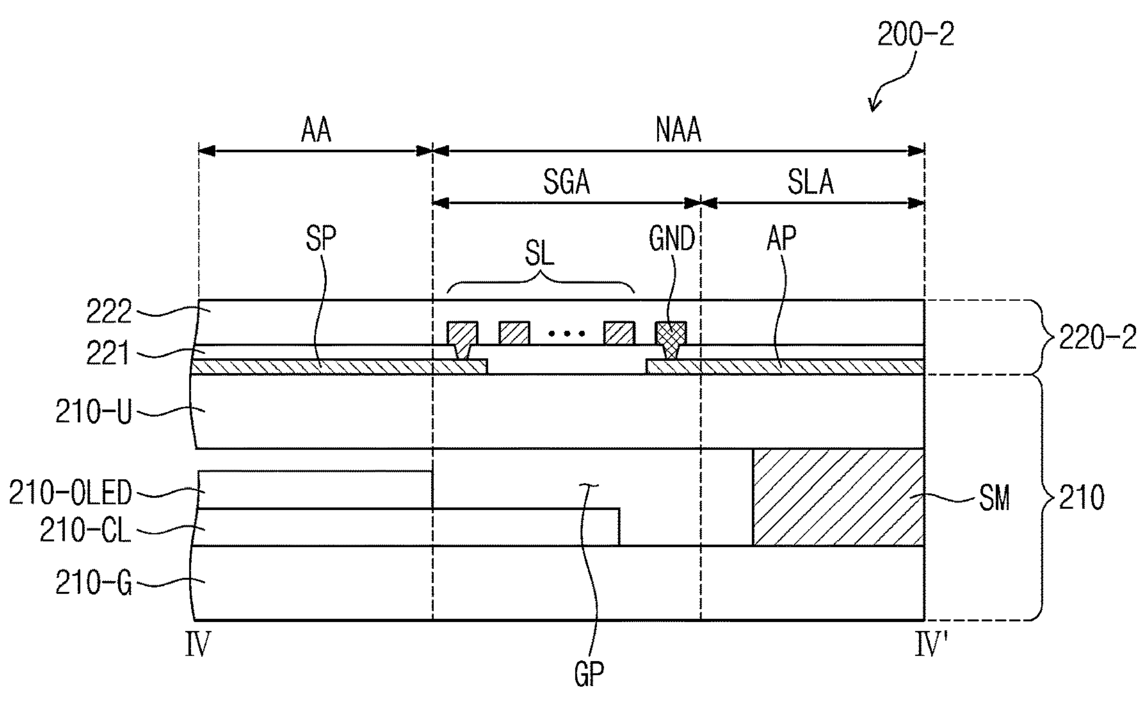
Figure 9:
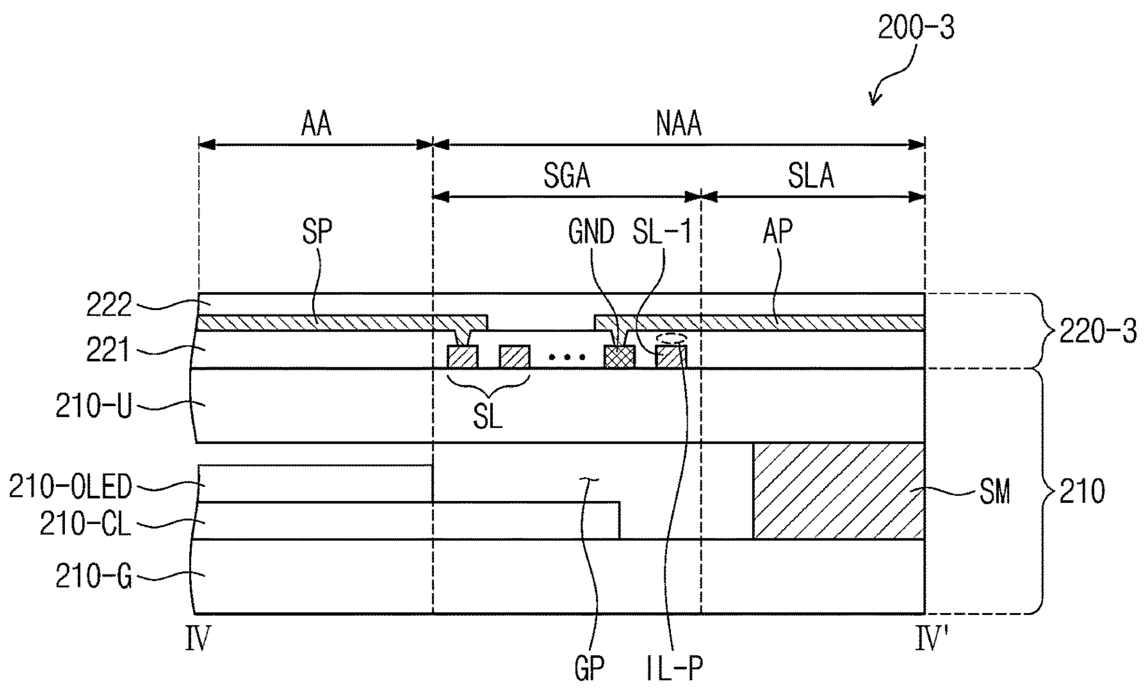
Figure 10:
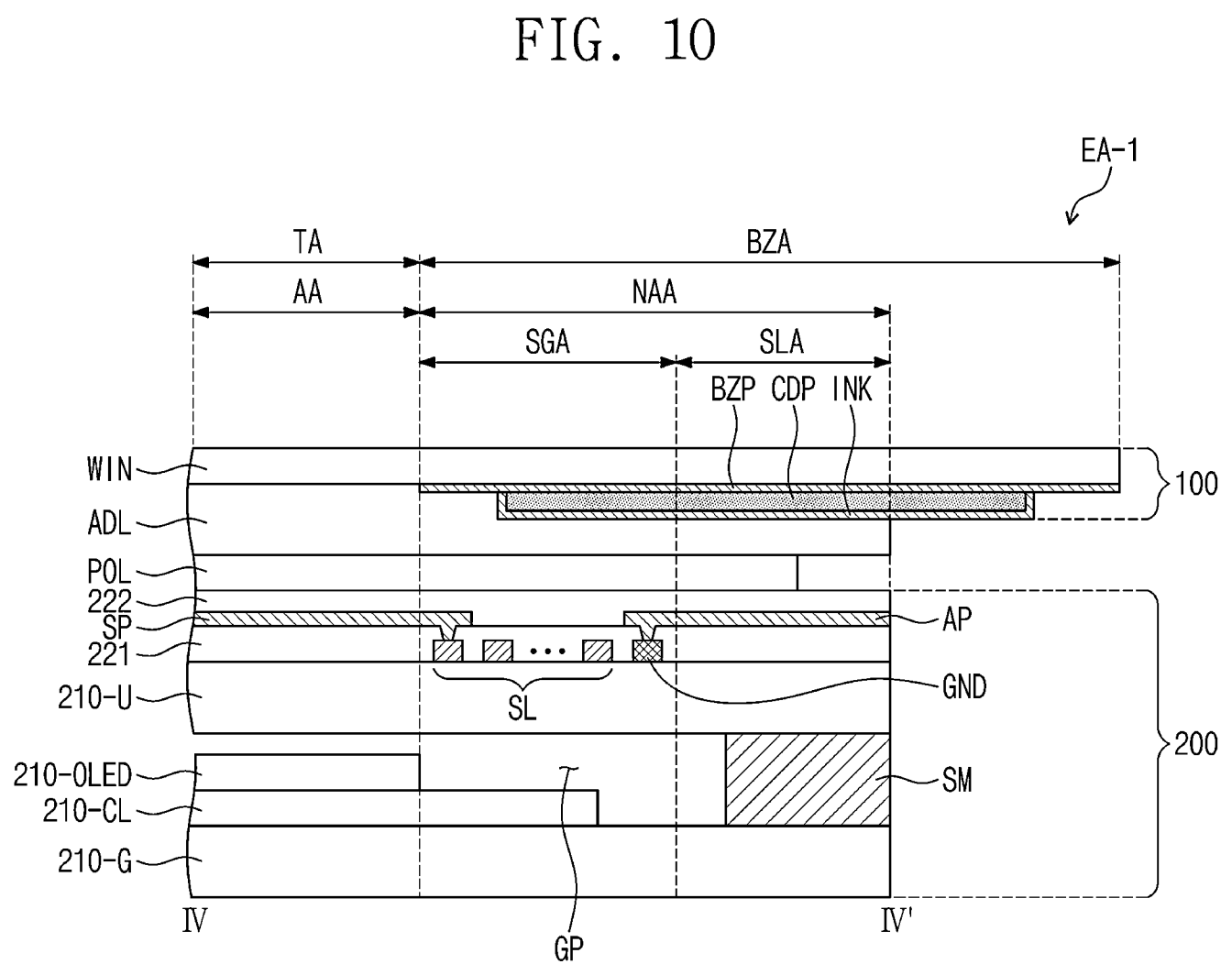

FIGS. 7 to 9 are respectively cross-sectional views of the display modules 200-1, 200-2 and 200-3 according to an embodiment of the present disclosure. FIG. 10 is a cross-sectional view of the display device EA-1 according to an embodiment of the present disclosure. FIGS. 7 to 9 illustrate display modules 200-1, 200-2, and 200-3 of an embodiment, which are different from the display module 200 of an embodiment illustrated in FIG. 5. FIG. 10 illustrates a display device EA-1 of an embodiment including the display module 200 of an embodiment illustrated in FIG. 5.

Referring to FIG. 7, in the display panel 210-1 included in the display module 200-1 of an embodiment, each of the encapsulation substrate 210-U and the base substrate 210-G may include a portion that protrudes from one side SM-S of the sealing member SM. In an embodiment, the encapsulation substrate 210-U included in the display module 200-1 may include an extension part EP that protrudes from one side SM-S of the sealing member SM.

In the display module 200-1 of an embodiment shown in FIG. 7, an input sensor 220-1 may further include a low-resistance pattern LRP that is disposed on the extension part EP. For example, in an embodiment the low-resistance pattern LRP may be disposed directly on the extension part EP of the encapsulation substrate 210-U.

In an embodiment, the low-resistance pattern LRP may be disposed on the same layer as that of the signal lines SL and the ground line GND. In an embodiment, the low-resistance pattern LRP may include the same material as that of the signal lines SL and the ground line GND, and the low-resistance pattern LRP, the signal lines SL and the ground line GND may be formed through the same process. The low-resistance pattern LRP may be disposed on (e.g., disposed directly thereon) the encapsulation substrate 210-U together with the signal lines SL and the ground line GND, and may be covered by the first insulating layer 221. The low-resistance pattern LRP may include a low-resistance metal.

In an embodiment, the low-resistance pattern LRP may be connected to (e.g., directly connected thereto) the additional electrode AP. As shown in FIG. 7, in an embodiment the low-resistance pattern LRP may be connected to (e.g., directly physically connected and electrically connected thereto) the additional electrode AP through a contact hole that passes through the first insulating layer 221. The low-resistance pattern LRP may be connected to the additional electrode AP, to which the ground voltage is applied, and may receive the ground voltage. The input sensor 220-1 of an embodiment may further include the low-resistance pattern LRP, and may further increase an area of the conductive pattern to which the ground voltage is applied.

Referring to FIG. 8, unlike the illustration of FIG. 5, in an input sensor 220-2 included in the display module 200-2 of an embodiment, the sensing pattern SP and the additional electrode AP may be disposed on a lower side (e.g., a lower layer), and the plurality of signal lines SL and the ground line GND may be disposed on an upper side (e.g., an upper layer). For example, in an embodiment as shown in FIG. 8, the sensing pattern SP and the additional electrode AP may be disposed under the first insulating layer 221 and the plurality of signal lines SL and the ground line GND may be disposed above the first insulating layer 221.

In the input sensor 220-2 of an embodiment shown in FIG. 8, the sensing pattern SP and the additional electrode AP may be disposed on the same layer as each other. In an embodiment, the sensing pattern SP and the additional electrode AP may include the same material as each other, and may be formed through the same process. The sensing pattern SP and the additional electrode AP may be disposed on (e.g., disposed directly thereon) the encapsulation substrate 210-U, and may be covered by the first insulating layer 221. In an embodiment, the sensing pattern SP and the additional electrode AP may include a transparent conductive oxide.

In an embodiment, the signal lines SL and the ground line GND may be disposed on the same layer as each other. In an embodiment, the signal lines SL and the ground line GND may include the same material as each other, and may be formed through the same process. The signal lines SL and the ground line GND may be disposed on the first insulating layer 221, and may be covered by the second insulating layer 222. For example, the signal lines SL and the ground line GND may be disposed directly on an upper surface of the first insulating layer 221. In an embodiment, the signal lines SL and the ground line GND may include a low-resistance metal.

Any corresponding one of the signal lines SL may be connected to the sensing pattern SP through a contact hole that passes through the first insulating layer 221. The ground line GND may be connected to (e.g., directly physically connected and electrically connected thereto) the additional electrode AP through a contact hole that passes through the first insulating layer 221. The additional electrode AP may be connected to the ground line GND, and may receive a ground voltage.

Referring to FIG. 9, unlike the illustration of FIG. 5, in an input sensor 220-3 included in the display module 200-3 of an embodiment, the ground line GND is not disposed on an outermost side of the wiring line area SGA, and at least one of the plurality of signal lines SL may be disposed at an outskirt of (e.g., a periphery of) the wiring line area SGA as compared to the ground line GND. As illustrated in FIG. 9, the plurality of signal lines SL may include an outer signal line SL-1 that is disposed on an outer side of the wiring line area SGA as compared to the ground line GND. The outer signal line SL-1 may be spaced apart from the active area AA with the ground line GND being interposed therebetween. FIG. 9 illustrates as an example that one outer signal line SL-1 is provided. However, embodiments of the present disclosure are not necessarily limited thereto and two or more outer signal lines SL-1 may be provided in some embodiments.

In an embodiment, the additional electrode AP may be connected to the ground line GND through a contact hole that passes through the first insulating layer 221. The additional electrode AP may be connected to (e.g., directly physically connected and electrically connected thereto) the ground line GND, and may receive a ground voltage.

The outer signal line SL-1 is insulated from the additional electrode AP. The outer signal line SL-1 overlaps the additional electrode AP on a plane (e.g., in the third direction DR3), but may be insulated from the additional electrode AP by an insulating pattern IL-P that is disposed on the outer signal line SL-1, such as an upper portion of the outer signal line SL-1, and extends between the outer signal line SL-1 and the additional electrode AP (e.g., in the third direction DR3). As illustrated in FIG. 9, the insulating pattern IL-P may be a portion of the first insulating layer 221. However, embodiments of the present disclosure are not necessarily limited thereto, and the insulating pattern IL-P may be a pattern that is provided separately from the first insulating layer 221 to cover the outer signal line SL-1 in some embodiments.

Referring to FIG. 10, the display device EA-1 of an embodiment may include the window 100, and the window 100 may include a base substrate WIN and a light shielding pattern BZP that is disposed under (e.g., disposed directly thereunder) the base substrate WIN. The light shielding pattern BZP may define the bezel area BZA, and may include a colored light shielding material to shield light. The light shielding pattern BZP may prevent the peripheral area NAA of the display module 200 from being viewed from an outside while covering the peripheral area NAA.

The window 100 may further include a conductive electrode CDP that is disposed under (e.g., dispose directly thereunder) the base substrate WIN. A lower portion of the conductive electrode CDP may be covered by an ink layer INK. The conductive electrode CDP may overlap the bezel area BZA. In an embodiment, the conductive electrode CDP may fully overlap the additional electrode AP on a plane (e.g., in the third direction DR3). In an embodiment, the conductive electrode CDP may be disposed to be expanded to (e.g., extended to) an outside of the sealing area SLA, in which the additional electrode AP is disposed.

In an embodiment, the conductive electrode CDP may include a metal material of a high conductivity. In the display device EA-1 of an embodiment, as the window 100 includes the conductive electrode CDP, a large capacitance may be formed between the conductive electrode CDP and the additional electrode AP, and thus, a potential corresponding to the ground voltage also may be formed in the conductive electrode CDP. Accordingly, the display device EA-1 of an embodiment may further increase an area of the conductive pattern, to which the ground voltage is applied. In an embodiment, the conductive electrode CDP may be directly connected to (e.g., electrically connected thereto) the additional electrode AP by a wiring line to receive the ground voltage.

Figure 11A:
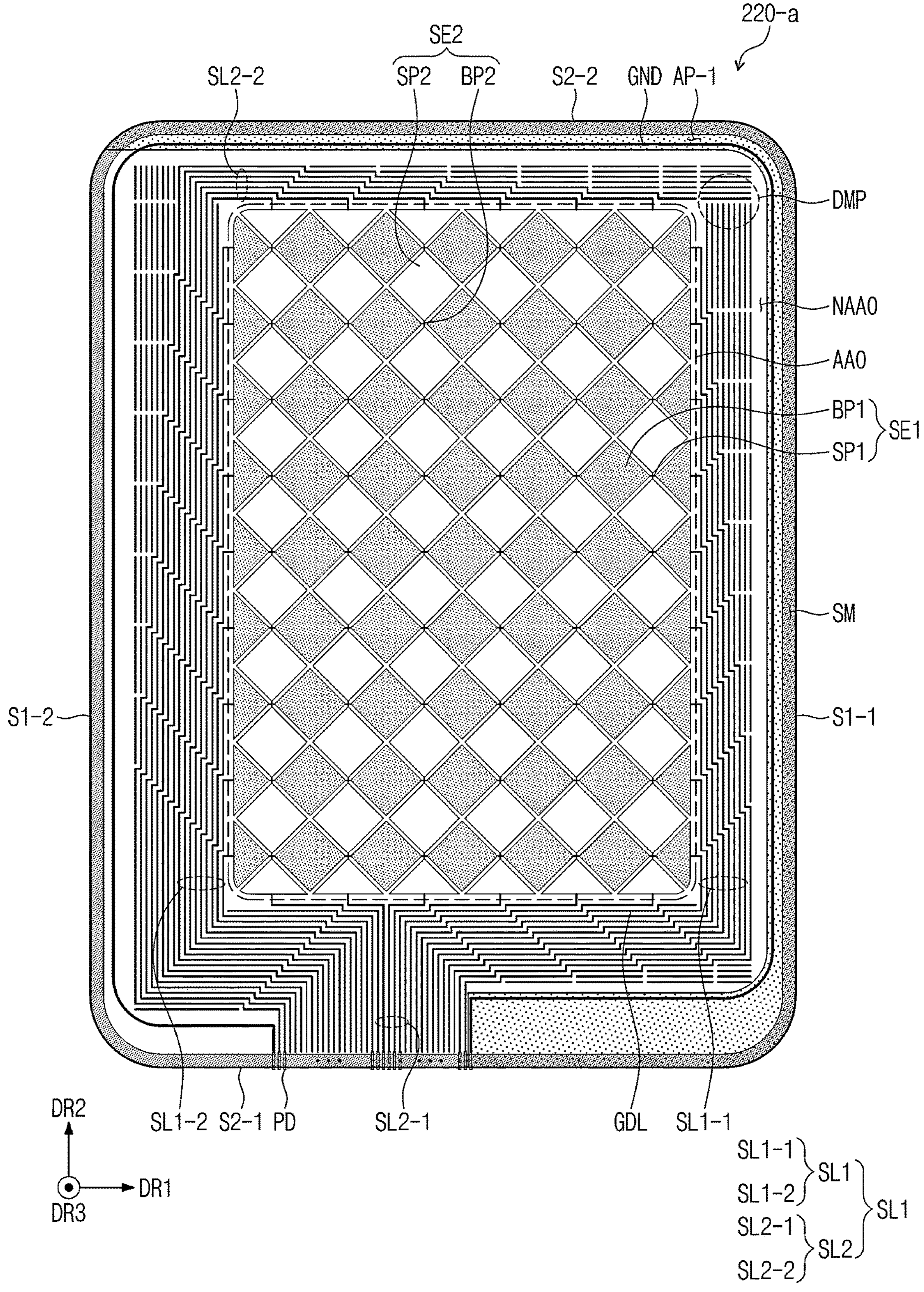
FIGS. 11A to 11C are plan views of an input sensor according to embodiments of the present disclosure.
Figure 11B:
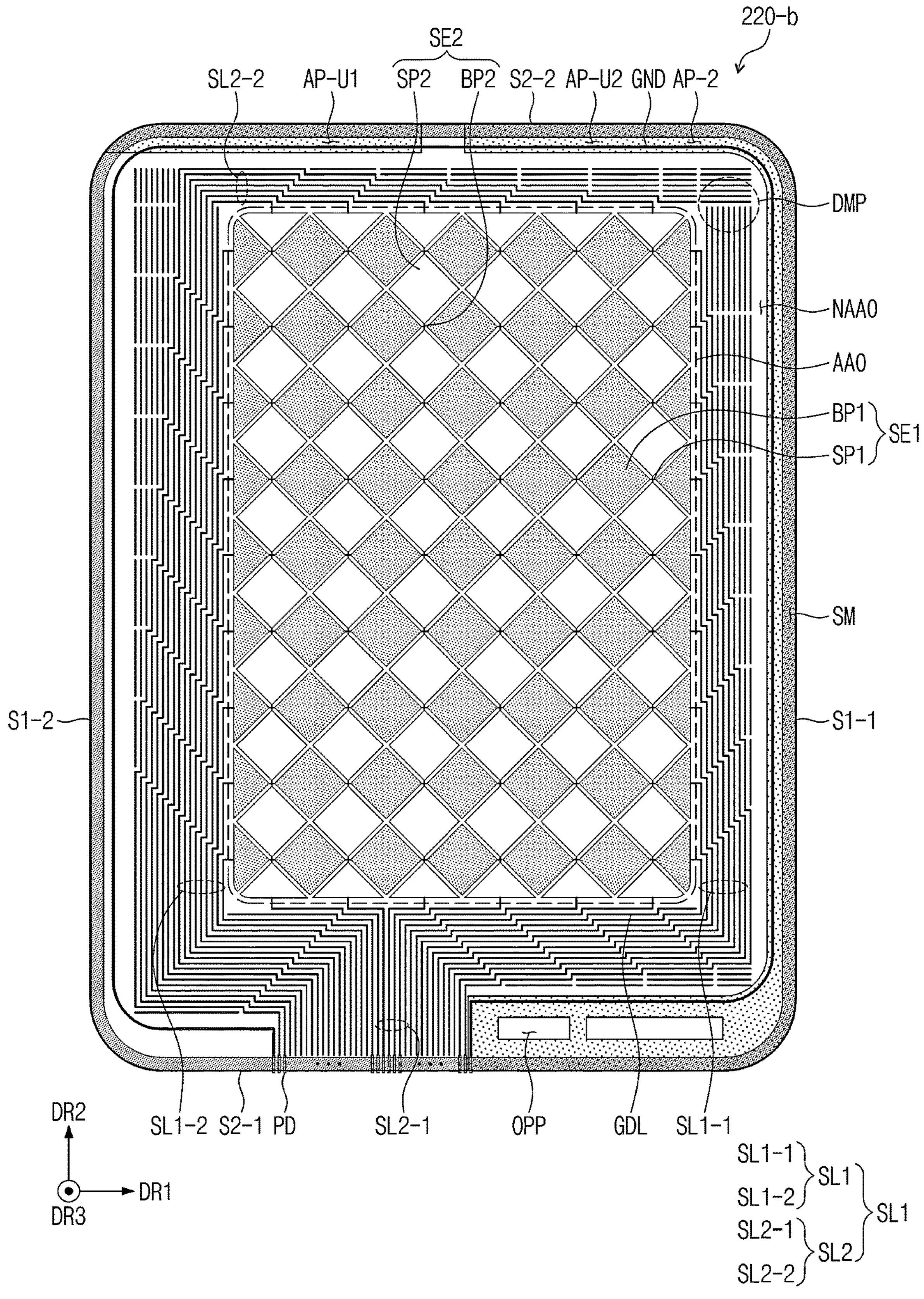
Figure 11C:
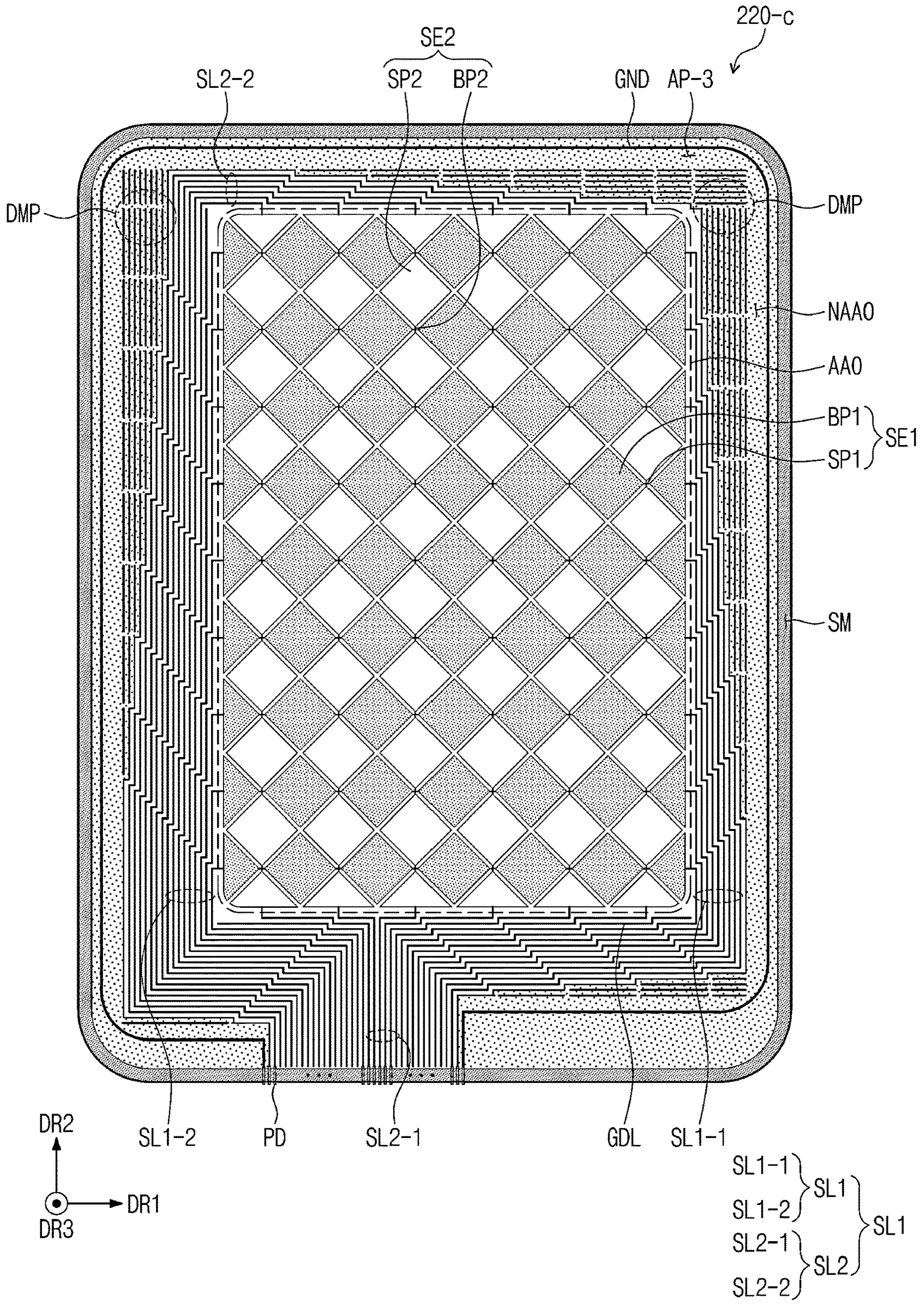
Figure 12:
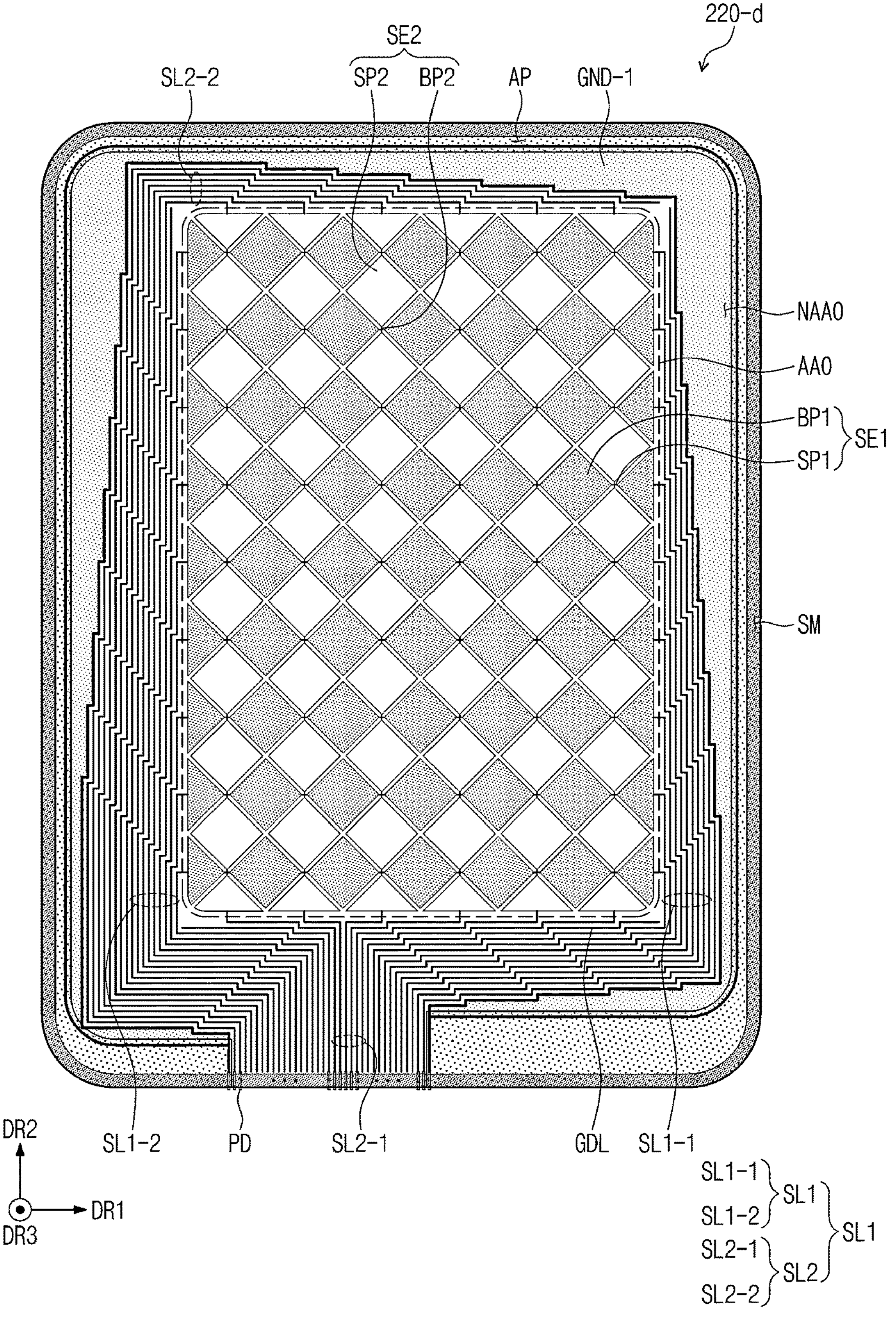
FIG. 12 is a plan view of an input sensor according to an embodiment of the present disclosure.

FIGS. 11A to 11C are plan views of the input sensors 220-*a*, 220-*b* and 220-*c* according to an embodiment of the present disclosure. FIG. 12 is a plan view of the input sensor 200-*d* according to an embodiment of the present disclosure. FIGS. 11A to 11C, and 12 illustrate input sensors 220-*a*, 220-*b*, 220-*c*, and 220-*d* of embodiments, which are different from the input sensor 220 of an embodiment illustrated in FIG. 3.

Referring to FIG. 11A, the input sensor 220-*a* of an embodiment may include two relatively long sides S1-1 and S1-2 that extend along the second direction DR2 and are spaced apart from each other along the first direction DR1, and two relatively short sides S2-1 and S2-2 that extend along the first direction DR1 and are spaced apart from each other along the second direction DR2. The input sensor 220-*a* may include the first long side S1-1 and the second long side S1-2. The input sensor 220-*a* may include the first short side S2-1 and the second short side S2-2.

In the input sensor 220-*a*, an additional electrode AP-1 may be disposed on at least one side of the two long sides S1-1 and S1-2 and the two short sides S2-1 and S2-2. As illustrated in FIG. 11A, the additional electrode AP-1 may be disposed at only a portion of the two long sides S1-1 and S1-2 and the two short sides S2-1 and S2-2. For example, as shown in FIG. 11A, the additional electrode AP-1 may be disposed at the first long side S1-1 (e.g., disposed at an entirety of the first long side S1-1), and may not be disposed at the second long side S1-2. The additional electrode AP-1 may be disposed at a portion of the first short side S2-1, and may be disposed at the second short side S2-2 (e.g., disposed at an entirety of the second short side S2-2). However, embodiments of the present disclosure are not necessarily limited thereto. For example, in an embodiment the additional electrode AP as illustrated in FIG. 3, may be disposed at all of the two long sides S1-1 and S1-2 and the two short sides S2-1 and S2-2, may be patterned and disposed only at a portion of each of the two long sides S1-1 and S1-2 and the two short sides S2-1 and S2-2, etc.

Referring to FIG. 11B, in the input sensor 220-*b* of an embodiment, an additional electrode AP-2 may be disposed on at least one side of the two long sides S1-1 and S1-2 and the two short sides S2-1 and S2-2, and a plurality of additional electrodes AP-2 may be provided on one side of the two long sides S1-1 and S1-2 and the two short sides S2-1 and S2-2. For example, as illustrated in FIG. 11B, the additional electrode AP-2 disposed at the second short side S2-2 may include a plurality of unit additional electrodes AP-U1 and AP-U2. In the additional electrode AP-2 disposed at the second short side S2-2, the first unit additional electrode AP-U1 and the second unit additional electrode AP-U2 may be spaced apart from each other in the first direction DR1. FIG. 11B exemplarily illustrates that the additional electrode AP-2 disposed at the second short side S2-2 includes two unit additional electrodes AP-U1 and AP-U2. However, embodiments of the present disclosure are not necessarily limited thereto, and the additional electrode AP-2 disposed at one side of the input sensor 220-*b* may include three or more unit additional electrodes.

In an embodiment, an opening OPP may be defined in the additional electrode AP-2 included in the input sensor 220-*b* of an embodiment. Due to the opening OPP, a crack may be prevented from being generated in the additional electrode AP-2. Furthermore, due to the opening OPP, a loop current may be prevented from being generated in the additional electrode AP-2.

Referring to FIG. 11C, the input sensor 220-*c* of an embodiment may further include the dummy patterns DMP. In the input sensor 220-*c* of an embodiment, an additional electrode AP-3 may not only overlap the ground line GND (e.g., in the third direction DR3) but also may additionally extend to overlap at least a portion of the dummy patterns DMP (e.g., in the third direction DR3). In an embodiment, the additional electrode AP-3 may be electrically connected to at least some of the dummy patterns DMP. For example, in an embodiment the additional electrode AP-3 may be connected to (e.g., directly physically connected and electrically connected thereto) at least some of the dummy patterns DMP by a contact hole that passes through the above-described first insulating layer 221 (see FIG. 5). The input sensor 220-*c* of an embodiment may further increase an area of the conductive pattern, to which the ground voltage is applied, through the structure, in which the additional electrode AP-3 also is connected to the dummy patterns DMP.

Referring to FIG. 12, in the input sensor 220-*d*, a ground line GND-1 overlaps the additional electrode AP on a plane (e.g., in the third direction DR3), and is electrically connected to the additional electrode AP. In an embodiment, unlike the illustration of FIG. 3, the ground line GND-1 may have a width (e.g., length in the first direction DR1 and/or second direction DR2) that is larger than those of the plurality of signal lines SL. As illustrated in FIG. 12, the ground line GND-1 may be disposed to be expanded to an area, in which the dummy patterns DMP are disposed in the input sensor 220 of FIG. 3. In an embodiment, the ground line GND-1 may overlap the plurality of signal lines SL in an extension direction of the signal lines SL. For example, the ground line GND-1 may overlap among the (2-2)-th signal lines SL2-2, a plurality of ones, in the first direction DR1 that is an extension direction of the (2-2)-th signal line SL2-2. The ground line GND-1 may overlap, among the (1-1)-th signal lines SL1-1, a plurality of ones, in the second direction DR2 that is an extension direction of the (1-1)-th signal line SL1-1.

According to an embodiment, in the input sensor included in the display device, scattering of the capacitances between the signal lines and the sensing electrodes may be reduced whereby the electromagnetic interference decreasing effect may be increased. Accordingly, the sensing performance of the input sensor and the display device including the same may be increased.

Furthermore, a process of curing the sealing member by a laser beam may be performed, and thus a process performance of the display device may be increased.

Although the present disclosure has been described with reference to non-limiting embodiments, it will be appreciated by an ordinary skilled in the art, to which the present disclosure pertains, that the present disclosure may be modified and changed within the scope of the appended claims without departing from the spirits and technical field of the present disclosure.

What is claimed is:

1. A display device comprising:

a display panel including an active area, and a peripheral area adjacent to the active area, the peripheral area including a wiring line area adjacent to the active area on a plane and a sealing area adjacent to the wiring line area and spaced apart from the active area by the wiring line area on the plane; and an input sensor disposed on the display panel, the input sensor including a sensing area corresponding to the active area, and a non-sensing area corresponding to the peripheral area, wherein the input sensor includes:

a plurality of sensing patterns disposed in the sensing area;

a plurality of signal lines connected to the plurality of sensing patterns, respectively, the plurality of signal lines is disposed in the non-sensing area and solely overlapping the wiring line area on the plane;

a ground line disposed in the non-sensing area and solely overlapping the wiring line area on the plane, the ground line receiving a ground voltage; and an additional electrode disposed in the non-sensing area and overlapping the wiring line area and the sealing area on the plane, the additional electrode is electrically connected to the ground line, wherein the display panel includes a sealing member solely disposed in the sealing area of the peripheral area, and wherein a portion of the additional electrode overlapping the sealing area on the plane overlaps at least a portion of the sealing member on the plane and is spaced apart from entireties of the plurality of signal lines and the ground line on the plane.

2. The display device of claim 1, wherein the ground line is spaced apart from the sensing area with the plurality of signal lines interposed therebetween.

3. The display device of claim 1, wherein the display panel includes:

a display substrate including a light emitting element; and an encapsulation substrate disposed on the display substrate, the sealing member bonding the display substrate to the encapsulation substrate, and wherein the input sensor is disposed directly on the encapsulation substrate.

4. The display device of claim 3, wherein one end of the sealing member is aligned with one end of the encapsulation substrate.

5. The display device of claim 3, wherein the encapsulation substrate includes an extension part extending from one end of the sealing member, and wherein the input sensor further includes:

a low-resistance pattern disposed directly on the extension part.

6. The display device of claim 1, wherein the additional electrode includes a same material as the plurality of sensing patterns.

7. The display device of claim 1, wherein each of the additional electrode and the plurality of sensing patterns includes a transparent conductive oxide.

8. The display device of claim 1, wherein the ground line includes a same material as the plurality of signal lines.

9. The display device of claim 1, wherein the plurality of signal lines include outer signal lines that are spaced apart from the sensing area with the ground line interposed therebetween, and wherein the input sensor further includes:

an insulating pattern covering an upper portion of the outer signal line.

10. The display device of claim 1, wherein the input sensor includes:

a first insulating layer disposed on the display panel; and a second insulating layer disposed on the first insulating layer.

11. The display device of claim 10, wherein:

the plurality of signal lines and the ground line are disposed under the first insulating layer; and the plurality of sensing patterns and the additional electrode are disposed above the first insulating layer.

12. The display device of claim 10, wherein:

the plurality of sensing patterns and the additional electrode are disposed under the first insulating layer; and the plurality of signal lines and the ground line are disposed above the first insulating layer.

13. The display device of claim 1, further comprising:

a window disposed on the input sensor, wherein the window includes:

a base substrate including a transmissive area that is optically transparent, and a bezel area adjacent to the transmissive area; and a conductive electrode overlapping the bezel area, the conductive electrode is disposed under the base substrate.

14. The display device of claim 1, wherein the input sensor further includes:

a dummy pattern disposed in the non-sensing area, the dummy pattern is disposed on a same layer as the plurality of signal lines, wherein the dummy pattern is spaced apart from the plurality of signal lines on a plane.

15. The display device of claim 14, wherein the additional electrode is electrically connected to at least a portion of the dummy pattern.

16. The display device of claim 1, wherein at least a portion of the ground line has a greater width than a width of each of the plurality of signal lines.

17. The display device of claim 1, wherein the input sensor includes:

two short sides extending along a first direction and spaced apart from each other along a second direction crossing the first direction, and two long sides extending along the second direction and spaced apart from each other along the first direction, and wherein the additional electrode is disposed on at least one side of the two short sides and the two long sides.

18. The display device of claim 1, wherein each of the ground line and the plurality of signal lines do not overlap the sealing member on a plane.

19. An electronic device comprising:

a display device comprising:

a display panel including an active area, and a peripheral area adjacent to the active area, the peripheral area including a wiring line area adjacent to the active area on a plane and a sealing area adjacent to the wiring line area and spaced apart from the active area by the wiring line area on the plane; and an input sensor disposed on the display panel, the input sensor including a sensing area corresponding to the active area, and a non-sensing area corresponding to the peripheral area, wherein the input sensor includes:

a plurality of signal lines disposed in the non-sensing area and solely overlapping the wiring line area on the plane;

a ground line disposed in the non-sensing area and solely overlapping the wiring line area on the plane; and an additional electrode disposed in the non-sensing area and overlapping the wiring line area and the sealing area on the plane, the additional electrode is electrically connected to the ground line, wherein the display panel includes a sealing member solely disposed in the sealing area of the peripheral area, wherein a portion of the additional electrode overlapping the sealing area on the plane overlaps the sealing member on the plane and is spaced apart from entireties of the plurality of signal lines and the ground line on the plane.

20. A display device comprising:

a display panel including an active area, and a peripheral area adjacent to the active area, the peripheral area including a wiring line area adjacent to the active area on a plane and a sealing area adjacent to the wiring line area and spaced apart from the active area by the wiring line area on the plane; and an input sensor disposed on the display panel, the input sensor including a sensing area corresponding to the active area, and a non-sensing area corresponding to the peripheral area, wherein the input sensor includes:

a plurality of sensing patterns disposed in the sensing area, the plurality of sensing patterns including a transparent conductive oxide;

a plurality of signal lines connected to the plurality of sensing patterns, respectively, the plurality of signal lines is disposed in the non-sensing area and solely overlapping the wiring area on the plane, the plurality of signal lines includes a low-resistance metal;

a ground line disposed in the non-sensing area and solely overlapping the wiring line area on the plane, the ground line including a low-resistance metal; and an additional electrode disposed in the non-sensing area and overlapping the wiring line area and the sealing area on the plane, the additional electrode is electrically connected to the ground line, the additional electrode including a transparent conductive oxide, wherein a portion of the additional electrode overlapping the sealing area on the plane is spaced apart from entireties of the plurality of signal lines and the ground line on the plane, and wherein the additional electrode is electrically insulated from the plurality of signal lines.

* * * * *